(12) United States Patent
Yokoyama et al.

(10) Patent No.: US 11,942,040 B2
(45) Date of Patent: Mar. 26, 2024

(54) DISPLAY DEVICE AND METHOD FOR DRIVING SAME

(71) Applicant: Sharp Kabushiki Kaisha, Sakai (JP)

(72) Inventors: Makoto Yokoyama, Sakai (JP); Nobuyuki Taya, Sakai (JP); Junichi Yamada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 31 days.

(21) Appl. No.: 17/783,046

(22) PCT Filed: Dec. 13, 2019

(86) PCT No.: PCT/JP2019/048966
§ 371 (c)(1),
(2) Date: Jun. 7, 2022

(87) PCT Pub. No.: WO2021/117228
PCT Pub. Date: Jun. 17, 2021

(65) Prior Publication Data
US 2023/0024395 A1    Jan. 26, 2023

(51) Int. Cl.
*G09G 3/3266*    (2016.01)

(52) U.S. Cl.
CPC ... *G09G 3/3266* (2013.01); *G09G 2300/0842* (2013.01); *G09G 2310/0286* (2013.01)

(58) Field of Classification Search
CPC .. G09G 3/3266; G09G 3/2085; G09G 3/3241; G09G 2300/0842; G09G 2310/0286; G09G 2310/0205; G09G 2310/0251; G09G 2320/0233; G09G 2230/00; G11C 19/28
See application file for complete search history.

(56) References Cited

U.S. PATENT DOCUMENTS

| | | | | |
|---|---|---|---|---|
| 2018/0082630 A1* | 3/2018 | Kim | ......... | G09G 3/22 |
| 2018/0130438 A1* | 5/2018 | Imajo | ......... | G09G 3/3677 |
| 2018/0204889 A1* | 7/2018 | Yu | ......... | H10K 59/131 |
| 2019/0043452 A1* | 2/2019 | Silvanto | ......... | G06F 1/1688 |
| 2019/0304999 A1* | 10/2019 | Wang | ......... | H01L 27/124 |

FOREIGN PATENT DOCUMENTS

| | | |
|---|---|---|
| JP | 2018-534613 A | 11/2018 |
| WO | 2017/172375 A1 | 10/2017 |

* cited by examiner

Primary Examiner — David Tung
(74) Attorney, Agent, or Firm — Keating & Bennett, LLP

(57) ABSTRACT

In a display device having a non-rectangular display unit, occurrence of a difference in luminance between a region with a high load and a region with a low load is suppressed. A region inside the display unit is segmented into a high-load region with a high load on horizontal scanning lines (an initialization control line and a write control line) and a low-load region with a low load on horizontal scanning lines. An initialization control line and a write control line that are disposed in the high-load region are driven by a discharge driver and a scan driver, respectively. An initialization control line and a write control line that are disposed in the low-load region both are driven by, for example, the discharge driver.

13 Claims, 26 Drawing Sheets

DISPLAY DEVICE AND METHOD FOR DRIVING SAME

TECHNICAL FIELD

The following disclosure relates to a display device including a non-rectangular display unit and a method for driving the display device.

BACKGROUND ART

In recent years, an organic EL display device including pixel circuits each including an organic EL element has been put to practical use. The organic EL element is also called an organic light-emitting diode (OLED), and is a self-emissive display element that emits light at luminance determined based on current flowing therethrough. As such, since the organic EL element is a self-emissive display element, the organic EL display device can easily achieve slimming down, a reduction in power consumption, an increase in luminance, etc., compared with a liquid crystal display device that requires a backlight, a color filter, and the like. Thus, in recent years, development of organic EL display devices has been actively promoted.

In a display unit of an organic EL display device there are disposed various types of control signal lines for controlling operation of pixel circuits. For example, in an organic EL display device that adopts an internal compensation scheme as a scheme for compensating for variations in the characteristics of drive transistors in pixel circuits, there are disposed, in a display unit, horizontal scanning lines of a plurality of types such as a write control line for controlling writing of a data signal into the pixel circuit, and an initialization control line for initializing an internal state of the pixel circuit.

Meanwhile, a known general organic EL display device has a rectangular display unit. However, in recent years, development of organic EL display devices having a non-rectangular display unit, such as organic EL display devices for watch applications and organic EL display devices for in-vehicle applications, have been promoted. A display device having a non-rectangular display unit is called "odd-shaped display". FIG. 27 is a diagram showing an example of a display unit 90 of an odd-shaped display. In this example, the display unit 90 includes a semicircular portion 90a and a rectangular portion 90b. FIG. 28 is a diagram showing another example of a display unit 90 of an odd-shaped display. In this example, the display unit 90 has a circular shape. In the odd-shaped display shown in FIG. 27, horizontal scanning lines in the display unit 90 are, for example, sequentially driven row by row in order indicated by an arrow given reference character 97. In the odd-shaped display shown in FIG. 28, horizontal scanning lines in the display unit 90 are, for example, sequentially driven row by row in order indicated by an arrow given reference character 98. By thus sequentially driving the horizontal scanning lines in the display unit 90 row by row, writing of data signals into pixel circuits is sequentially performed row by row, by which a desired image is displayed on the display unit 90.

Note that in relation to this subject, JP 2018-534613 T discloses an invention of a display device that provides gate signals with different pulse widths to a short gate line and a long gate line.

PRIOR ART DOCUMENT

Patent Document

[Patent Document 1] JP 2018-534613 T

SUMMARY

Problems to be Solved by the Invention

However, in an odd-shaped display, the length of a horizontal scanning line varies from region to region. For example, in the odd-shaped display shown in FIG. 27, horizontal scanning lines disposed in a region given reference character 91 are remarkably short compared with horizontal scanning lines disposed in a region given reference character 92 and a region given reference character 93. In addition, in the odd-shaped display shown in FIG. 28, horizontal scanning lines disposed in a region given reference character 94 and a region given reference character 96 are remarkably short compared with horizontal scanning lines disposed in a region given reference character 95. When the length of a horizontal scanning line thus greatly varies from region to region, a difference in load (load capacitance) between the regions is also large.

The region given reference character 91 in FIG. 27 and the regions given reference characters 94 and 96 in FIG. 28 are regions with a very low load. Such regions are hereinafter referred to as "low-load regions", and regions (e.g., the regions given reference characters 92 and 93 in FIG. 27 and the region given reference character 95 in FIG. 28) other than the low-load regions are hereinafter referred to as "high-load regions".

In a high-load region, the waveform of a control signal that is provided to a horizontal scanning line is rounded such as, for example, a waveform given reference character Va in FIG. 29. On the other hand, in a low-load region, particularly, when the load capacitance is close to 0, the waveform of a control signal exhibits abrupt changes such as, for example, a waveform given reference character Vb in FIG. 29 (a pulse of the control signal has an abrupt rise and fall). Hence, regarding changes in the waveform of the control signal, a large differential delay occurs between the low-load region and the high-load region. Such differential delay causes a difference in luminance between the low-load region and the high-load region.

In addition, when transistors in drivers that drive horizontal scanning lines (e.g., a scan driver and a discharge driver which will be described later) have depletion characteristics, the drivers are susceptible to noise, and thus, there is a concern, for example, that a pulse of a control signal may go into an oscillation state (despite the fact that one pulse is supposed to be outputted, a plurality of pulses are consecutively outputted).

Note that as measures against a phenomenon such as that described above, a dummy load may be provided in the low-load region. However, since a panel has an odd shape, in many cases, it is difficult to secure a region in which a dummy load is provided. In addition, in terms of increasing needs for a narrow picture-frame, it is not desirable to provide a dummy load.

Hence, an object of the following disclosure is to suppress occurrence of a difference in luminance between a region with a high load and a region with a low load in a display device having a non-rectangular display unit.

Means for Solving the Problems

A display device according to some embodiments of the present disclosure is a display device including: a display unit in which scanning lines of a plurality of types are disposed as horizontal scanning lines; and a plurality of scanning drive circuits configured to drive the scanning lines of the respective plurality of types, the display unit having a non-rectangular shape, wherein a region inside the display unit is segmented into a high-load region with a high load on the horizontal scanning lines and a low-load region with a low load on the horizontal scanning lines, scanning lines of the plurality of types disposed in the high-load region are driven by the respective plurality of scanning drive circuits, and scanning lines of the plurality of types disposed in the low-load region are driven by one of the plurality of scanning drive circuits.

A drive method (for a display device) according to some embodiments of the present disclosure is a method for driving a display device including a display unit in which scanning lines of a plurality of types are disposed as horizontal scanning lines, the display unit having a non-rectangular shape, the method including:

a low-load region driving step of driving, by one of the plurality of scanning drive circuits, scanning lines of the plurality of types disposed in a low-load region with a low load on the horizontal scanning lines, the low-load region being a part of a region inside the display unit; and a high-load region driving step of driving, by a plurality of scanning drive circuits, scanning lines of the plurality of types disposed in a high-load region with a high load on the horizontal scanning lines, the high-load region being a part of the region inside the display unit.

Effects of the Invention

According to some embodiments of the present disclosure, in the display device having a non-rectangular display unit, in a high-load region, scanning lines of a plurality of types are driven by their corresponding scanning drive circuits, whereas in a low-load region, scanning lines of a plurality of types are driven by one scanning drive circuit. That is, regarding horizontal scanning lines disposed in the low-load region, when taking a look at each row, a plurality of horizontal scanning lines are driven by one scanning drive circuit. Hence, abrupt changes in the waveforms of control signals that are provided to the horizontal scanning lines disposed in the low-load region are suppressed. As a result, differential delay in changes in the waveforms of control signals between the low-load region and the high-load region decreases over known display devices, suppressing occurrence of a difference in luminance between the low-load region and the high-load region. As above, the display device having a non-rectangular display unit can suppress occurrence of a difference in luminance between the low-load region and the high-load region.

MODES FOR CARRYING OUT THE INVENTION

<0. Preface>

In recent years, a remarkable increase in the size and resolution of a panel of an organic EL display device has been achieved. Therefore, the load on horizontal scanning lines disposed in a display unit is remarkably high compared with known display devices. Hence, it is conceivable that the horizontal scanning lines are driven by drivers of a plurality of channels. Note that in the following description, a scheme in which the horizontal scanning lines are driven by a driver of one channel is referred to as "one-channel driving", a scheme in which the horizontal scanning lines are driven by drivers of two channels is referred to as "two-channel driving", and a scheme in which the horizontal scanning lines are driven by drivers of three channels is referred to as "three-channel driving". Note also that schemes in which the horizontal scanning lines are driven by drivers of two or more channels are collectively referred to as "multi-channel driving".

In an odd-shaped display, when multi-channel driving is adopted, too, a difference in luminance between a low-load region and a high-load region such as that described above can occur. Meanwhile, regarding the multi-channel driving, control signals of the similar waveforms are provided to a plurality of write control lines and a plurality of initialization control lines which will be described later. Thus, when the load on the horizontal scanning lines is low, even if the write control lines and the initialization control lines are driven by one driver, a problem is not expected to occur. Hence, in order to suppress occurrence of a difference in luminance between the low-load region and the high-load region, in the following embodiments, a scheme is adopted in which multi-channel driving is performed in the high-load region and one-channel driving is performed in the low-load region.

The embodiments will be described below with reference to the accompanying drawings. In each embodiment, it is assumed that there are n pixel circuits in a vertical scanning direction. Note that regarding the second to fourth embodiments, differences from a first embodiment will be mainly described and description of the same matters as those of the first embodiment is omitted as appropriate.

1. First Embodiment

<1.1 Overall Configuration>

Figure 2:
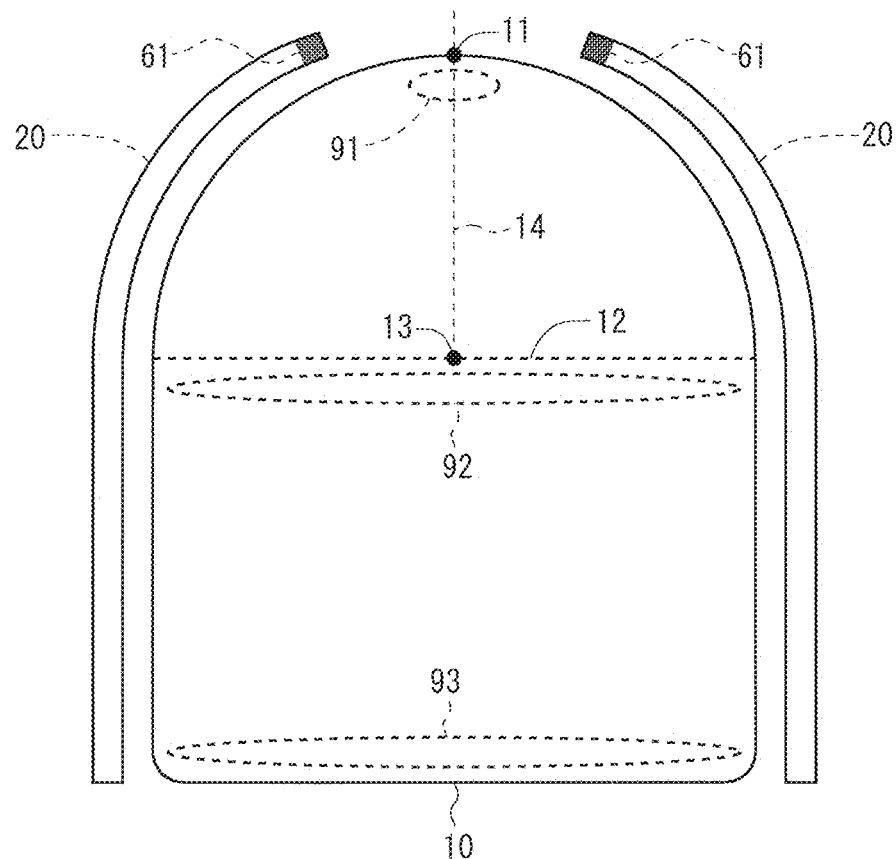
FIG. 2 is a schematic plan view of an organic EL display device of the first embodiment.
Figure 27:
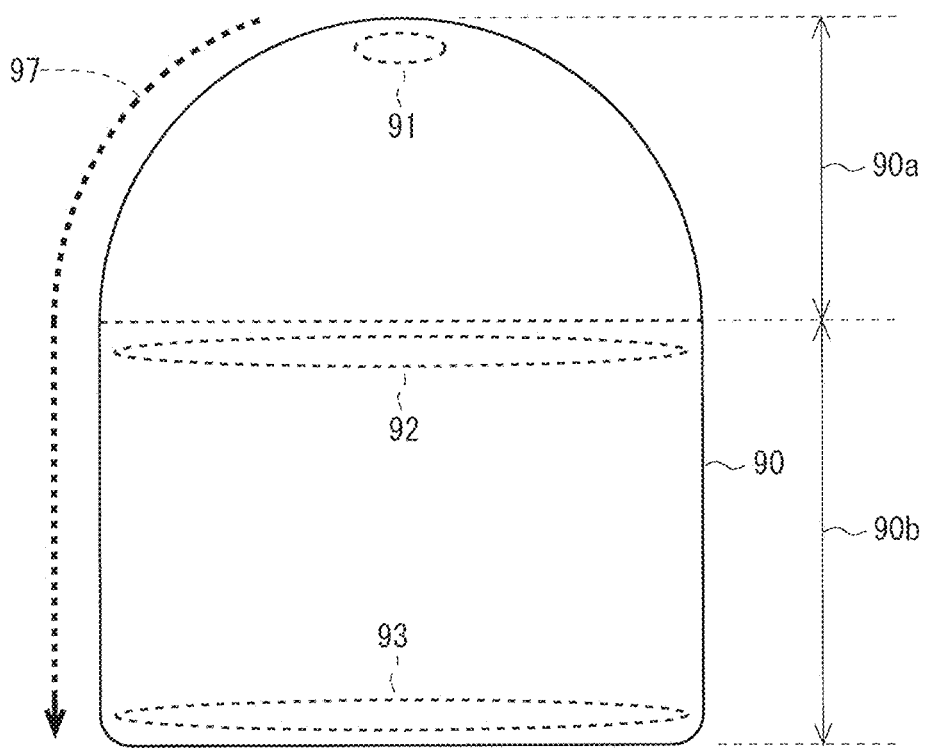
FIG. 27 is a diagram showing an example of a display unit of an odd-shaped display in a known example.

FIG. 2 is a schematic plan view of an organic EL display device of the first embodiment. FIG. 2 shows a display unit 10 and panel driving unit 20 of the organic EL display device. In the present embodiment, the display unit 10 includes a semicircular portion and a rectangular portion, as with the display unit 90 shown in FIG. 27. That is, the display unit 10 has a shape obtained by combining a semicircle and a rectangle. As can be grasped from FIG. 2, a vertex 11 of the semicircle is located on a straight line 14 extending in a vertical scanning direction with reference to a center 13 of a linear portion 12 of the semicircle.

Figure 3:
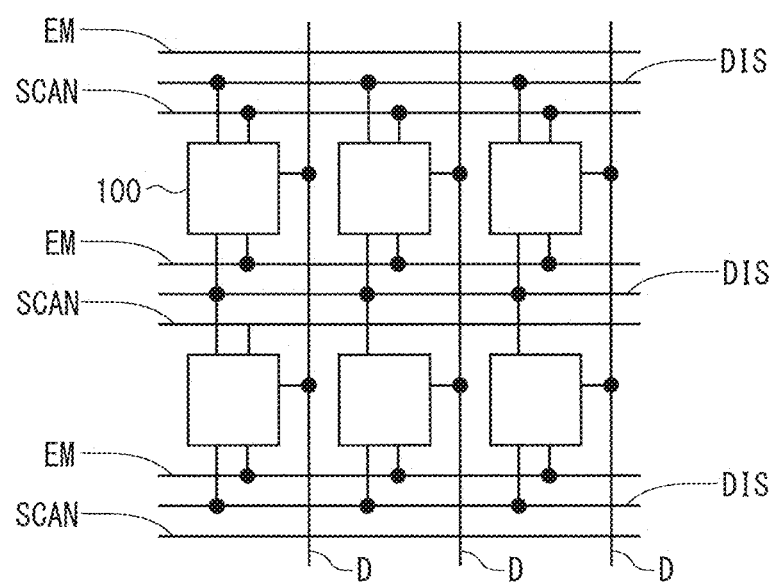
FIG. 3 is a diagram showing a configuration of a part of the inside of a display unit in the first embodiment.

FIG. 3 is a diagram showing a configuration of a part of the inside of the display unit 10. The display unit 10 is provided with a plurality of pixel circuits 100. In addition, in the display unit 10 there are disposed a plurality of write control lines SCAN, a plurality of initialization control lines DIS, a plurality of light emission control lines EM, and a plurality of data signal lines D. The write control lines SCAN, the initialization control lines DIS, and the light emission control lines EM extend in a horizontal scanning direction, and the data signal lines D extend in the vertical scanning direction. In the following description, write control signals that are provided to the write control lines SCAN are also given reference character SCAN as necessary, initialization control signals that are provided to the initialization control lines DIS are also given reference character DIS as necessary, light emission control signals that are provided to the light emission control lines EM are also given reference character EM as necessary, and data signals that are provided to the data signal lines D are also given reference character D as necessary. Note that in the present embodiment, the write control lines SCAN and the initialization control lines DIS correspond to scanning lines of a plurality of types (two types).

In addition, in the display unit 10 there are disposed power supply lines (not shown) common to the plurality of pixel circuits 100. More specifically, there are disposed a power supply line that supplies a high-level power supply voltage for driving organic EL elements (hereinafter, referred to as "high-level power supply line".), a power supply line that supplies a low-level power supply voltage for driving the organic EL elements (hereinafter, referred to as "low-level power supply line".), and a power supply line that supplies an initialization voltage (hereinafter, referred to as "initialization power supply line".). The low-level power supply voltage, the high-level power supply voltage, and the initialization voltage are supplied from a power supply circuit which is not shown. Note that the high-level power supply line corresponds to a first power supply line and the low-level power supply line corresponds to a second power supply line.

Figure 4:
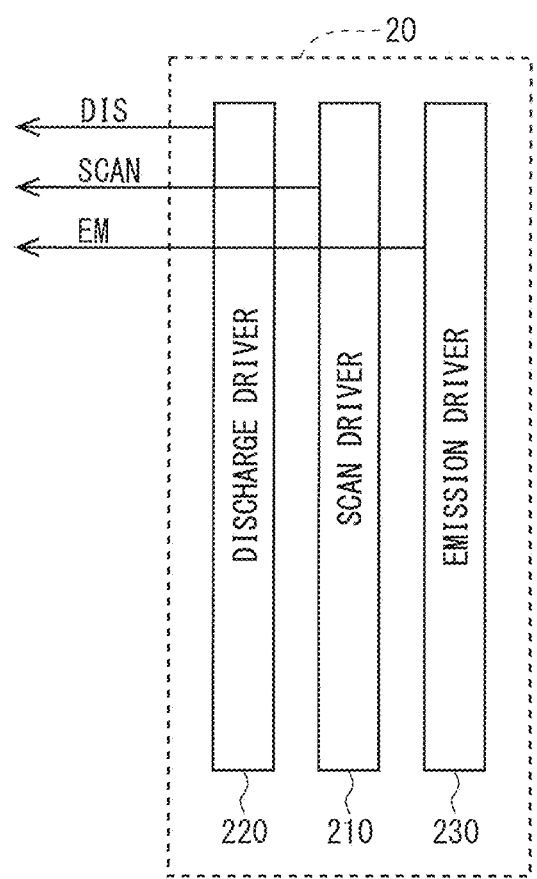
FIG. 4 is a diagram showing an internal functional configuration of a panel driving unit in the first embodiment.

FIG. 4 is a diagram showing an internal functional configuration of a panel driving unit 20. The panel driving unit 20 includes a scan driver (write control circuit) 210 that drives the write control lines SCAN, a discharge driver (initialization control circuit) 220 that drives the initialization control lines DIS, and an emission driver (light emission control circuit) 230 that drives the light emission control lines EM.

As shown in FIG. 2, a panel driving unit 20 is provided along an outer edge portion on the left side (the left side in FIG. 2) of the display unit 10. Likewise, a panel driving unit 20 is provided along an outer edge portion on the right side (the right side in FIG. 2) of the display unit 10. Since such a configuration is adopted, the write control lines SCAN, the initialization control lines DIS, and the light emission control lines EM which are disposed in the display unit 10 are driven from both of a one-edge side and an other-edge side of the display unit 10. Note that a source driver that drives the data signal lines D is provided, for example, on the lower side (the lower side in FIG. 2) of the display unit 10.

Meanwhile, in the present embodiment, regarding driving of horizontal scanning lines (the write control lines SCAN and the initialization control lines DIS), two-channel driving is performed in a high-load region and one-channel driving is performed in a low-load region. In FIG. 2, a portion having components that adopt one-channel driving among the components of each panel driving unit 20 is given reference character 61.

Figure 5:
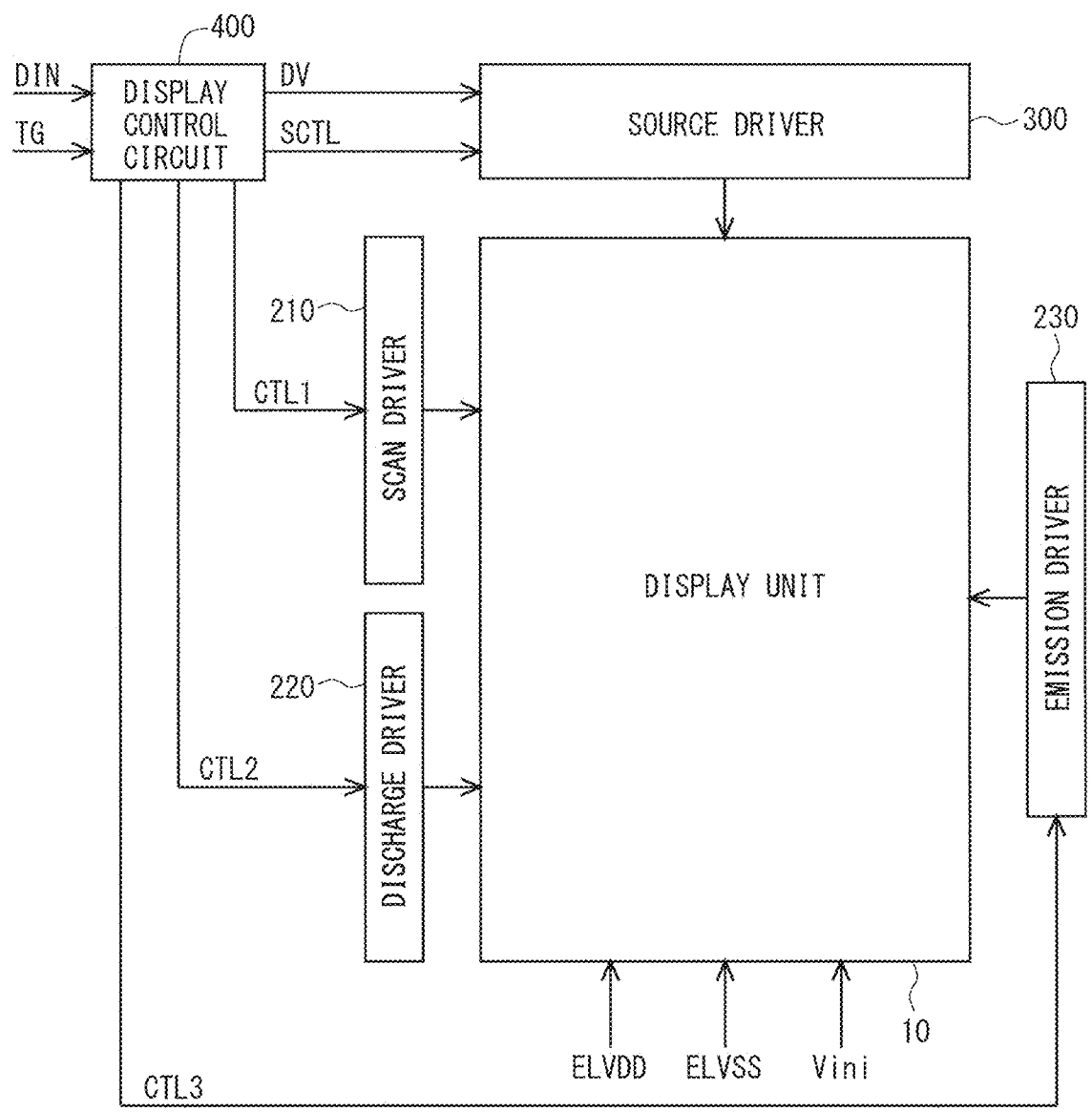
FIG. 5 is a functional block diagram showing a functional configuration of the organic EL display device in the first embodiment.

FIG. 5 is a functional block diagram showing a functional configuration of the organic EL display device. As shown in FIG. 5, the organic EL display device includes a display unit 10, a scan driver 210, a discharge driver 220, an emission driver 230, a source driver 300, and a display control circuit 400.

Operation of each component shown in FIG. 5 will be described below. The display control circuit 400 receives an input image signal DIN and a timing signal group (a horizontal synchronizing signal, a vertical synchronizing signal, etc.) TG which are transmitted from an external source, and outputs digital video signals DV, control signals CTL1 that control operation of the scan driver 210, control signals CTL2 that control operation of the discharge driver 220, a control signal CTL3 that controls operation of the emission driver 230, and a control signal SCTL that controls operation of the source driver 300.

The scan driver 210 applies write control signals to a plurality of write control lines SCAN, based on the control signals CTL1 outputted from the display control circuit 400. The discharge driver 220 applies initialization control signals to a plurality of initialization control lines DIS, based on the control signals CTL2 outputted from the display control circuit 400. The emission driver 230 applies light emission control signals to a plurality of light emission control lines EM, based on the control signal CTL3 outputted from the display control circuit 400. The source driver 300 applies data signals to a plurality of data signal lines D, based on the digital video signals DV and the control signal SCTL which are outputted from the display control circuit 400.

In the above-described manner, the write control signals are applied to the plurality of write control lines SCAN, the initialization control signals are applied to the plurality of initialization control lines DIS, the light emission control signals are applied to the plurality of light emission control lines EM, and the data signals are applied to the plurality of data signal lines D, by which an image based on the input image signal DIN is displayed on the display unit 10.

<1.2 Configuration of a Pixel Circuit>

Figure 6:
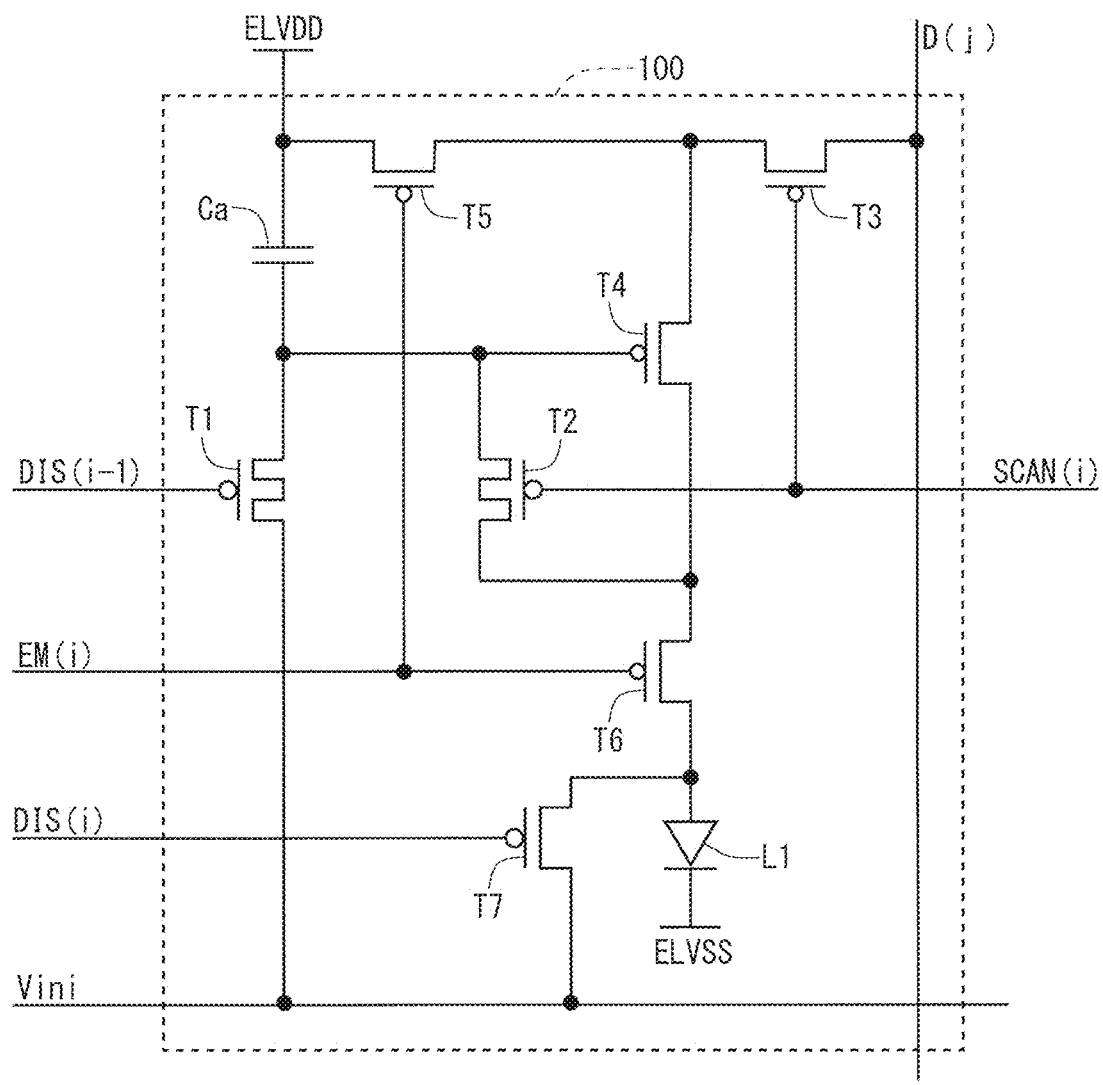
FIG. 6 is a circuit diagram showing a configuration of a pixel circuit in an ith row and a jth column in the first embodiment.

Next, a configuration of a pixel circuit 100 in the display unit 10 will be described. FIG. 6 is a circuit diagram showing a configuration of a pixel circuit 100 in an ith row and a jth column. The pixel circuit 100 includes one organic EL element (organic light-emitting diode) L1 which serves as a display element (a display element driven by current); seven transistors (typically, thin-film transistors) T1 to T7 (a first initialization transistor T1, a threshold voltage compensation transistor T2, a write control transistor T3, a drive transistor T4, a power supply control transistor T5, a light emission control transistor T6, and a second initialization transistor T7); and one holding capacitor Ca. The holding capacitor Ca is a capacitive element including two electrodes (a first electrode and a second electrode). The transistors T1 to T7 are P-channel type transistors. The first initialization transistor T1 and the threshold voltage compensation transistor T2 are double-gate transistors having two control terminals (gate terminals).

The first initialization transistor T1 is connected at its control terminal to an initialization control line DIS(i−1) in an (i−1)th row, connected at its first conductive terminal to a second conductive terminal of the threshold voltage compensation transistor T2, a control terminal of the drive transistor T4, and the second electrode of the holding capacitor Ca, and connected at its second conductive terminal to an initialization power supply line Vini. The threshold voltage compensation transistor T2 is connected at its control terminal to a write control line SCAN(i) in the ith row, connected at its first conductive terminal to a second conductive terminal of the drive transistor T4 and a first conductive terminal of the light emission control transistor T6, and connected at its second conductive terminal to the first conductive terminal of the first initialization transistor T1, the control terminal of the drive transistor T4, and the second electrode of the holding capacitor Ca. The write control transistor T3 is connected at its control terminal to the write control line SCAN(i) in the ith row, connected at its first conductive terminal to a data signal line D(j) in a jth column, and connected at its second conductive terminal to a first conductive terminal of the drive transistor T4 and a second conductive terminal of the power supply control transistor T5. The drive transistor T4 is connected at its control terminal to the first conductive terminal of the first initialization transistor T1, the second conductive terminal of the threshold voltage compensation transistor T2, and the second electrode of the holding capacitor Ca, connected at its first conductive terminal to the second conductive terminal of the write control transistor T3 and the second conductive terminal of the power supply control transistor T5, and connected at its second conductive terminal to the first conductive terminal of the threshold voltage compensation transistor T2 and the first conductive terminal of the light emission control transistor T6.

The power supply control transistor T5 is connected at its control terminal to a light emission control line EM(i) in the ith row, connected at its first conductive terminal to a high-level power supply line and the first electrode of the holding capacitor Ca, and connected at its second conductive terminal to the second conductive terminal of the write control transistor T3 and the first conductive terminal of the drive transistor T4. The light emission control transistor T6 is connected at its control terminal to the light emission control line EM(i) in the ith row, connected at its first conductive terminal to the first conductive terminal of the threshold voltage compensation transistor T2 and the second conductive terminal of the drive transistor 14, connected at its second conductive terminal to a first conductive terminal of the second initialization transistor T7 and an anode terminal of the organic EL element L1. The second initialization transistor T7 is connected at its control terminal to an initialization control line DIS (i) in the ith row, connected at its first conductive terminal to the second conductive terminal of the light emission control transistor T6 and the anode terminal of the organic EL element L1, and connected at its second conductive terminal to the initialization power supply line Vini. The holding capacitor Ca is connected at its first electrode to the high-level power supply line and the first conductive terminal of the power supply control transistor T5, and connected at its second electrode to the first conductive terminal of the first initialization transistor T1, the second conductive terminal of the threshold voltage compensation transistor T2, and the control terminal of the drive transistor T4. The organic EL element L1 is connected at its anode terminal to the second conductive terminal of the light emission control transistor T6 and the first conductive terminal of the second initialization transistor T7, and connected at its cathode terminal to a low-level power supply line.

<1.3 Configurations of the Scan Driver and the Discharge Driver>

<1.3.1 Shift Registers>

Figure 1:
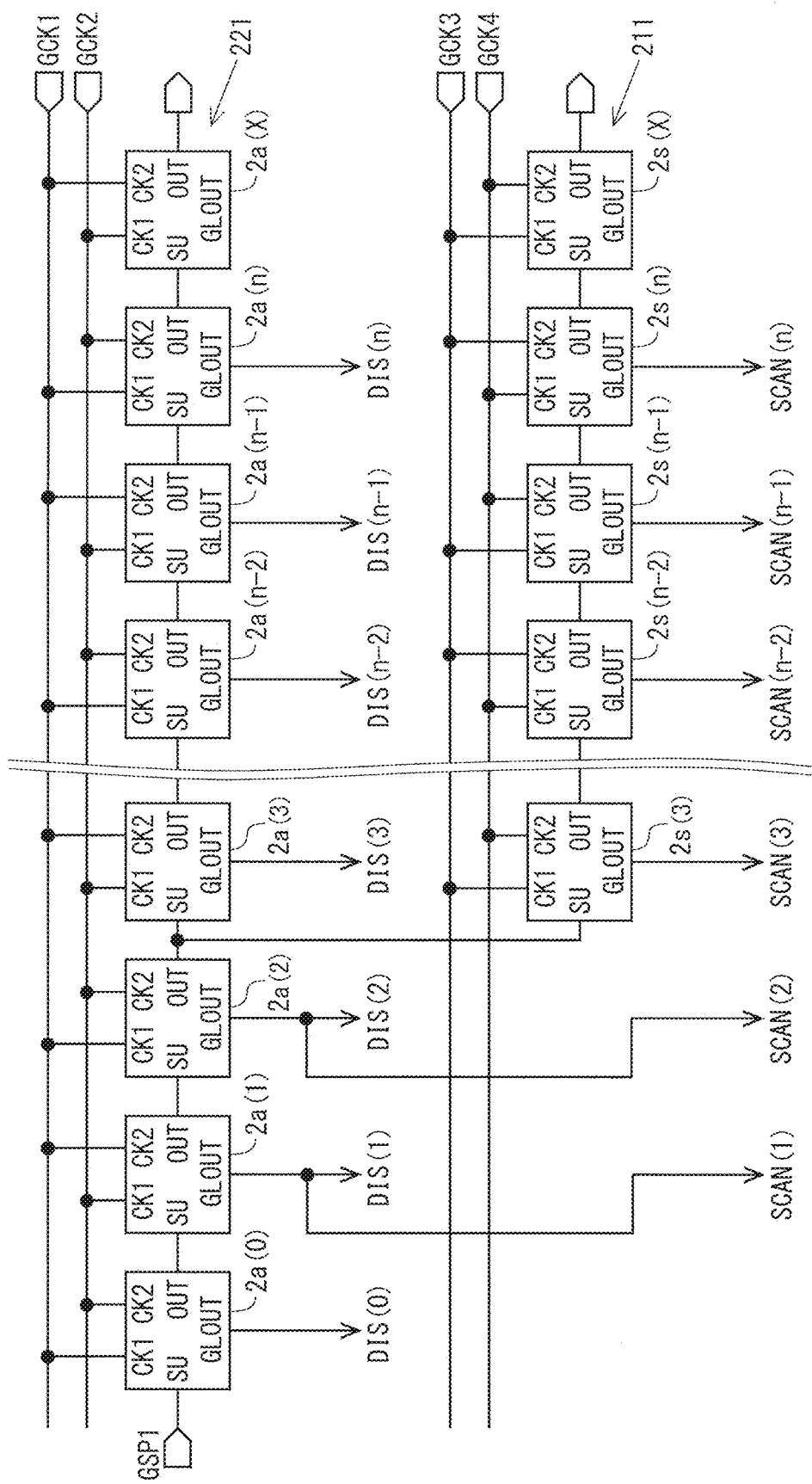
FIG. 1 is a block diagram showing configurations of a scan driver and a discharge driver in a first embodiment.

FIG. 1 is a block diagram showing configurations of a scan driver 210 and a discharge driver 220. The scan driver 210 and the discharge driver 220 each include a shift register having a plurality of stages. Note that in the following description, a circuit constituting each stage of the shift registers is referred to as "unit circuit". Specifically, the scan driver 210 includes a shift register 211 including unit circuits 2s(3) to 2s(n) corresponding to the third to nth rows; and a dummy unit circuit 2s(X) on an output-end side. Specifically, the discharge driver 220 includes a shift register 221 including a dummy unit circuit 2a(0) on an input-end side; unit circuits 2a(1) to 2a(n) corresponding to the first to nth rows; and a dummy unit circuit 2a(X) on an output-end side. The dummy unit circuits are unit circuits that do not directly contribute to display. Note that in the following description, when an unspecified unit circuit is referred to, the unit circuit is given reference character 2.

Meanwhile, in the present embodiment, the first and second rows correspond to a low-load region and the third to nth rows correspond to a high-load region. In other words, a region inside the display unit 10 is segmented into the first and second rows being a low-load region with a low load on horizontal scanning lines; and the third to nth rows being a high-load region with a high load on horizontal scanning lines. As such, a region near the vertex 11 of the semicircle (see FIG. 2) in the region inside the display unit 10 is segmented as the low-load region.

As can be grasped from FIG. 1, the shift register 221 included in the discharge driver 220 is provided with unit circuits 2 for all rows, but the shift register 211 included in the scan driver 210 is not provided with unit circuits 2 corresponding to the first and second rows being the low-load region. That is, excluding the unit circuits 2 that do not contribute to display, the shift register 221 includes the unit circuits 2a(1) and 2a(2) corresponding to the first and second rows being the low-load region; and the unit circuits 2a(3) to 2a(n) corresponding to the third to nth rows being the high-load region, whereas the shift register 211 includes only the unit circuits 2s(3) to 2s(n) corresponding to the third to nth rows being the high-load region.

In addition, when taking a look at horizontal scanning lines disposed in the low-load region, for each row, a write control line SCAN and an initialization control line DIS are connected to each other (see FIG. 1). As such, for the horizontal scanning lines disposed in the low-load region, two scanning lines (a write control line SCAN and an initialization control line DIS) which are scanning lines of two types are connected to each other for each row.

To the shift register 211 there are provided gate clock signals GCK3 and GCK4 as the above-described control signals CTL1. To the shift register 221 there are provided a gate start pulse signal GSP1 and gate clock signals GCK1 and GCK2 as the above-described control signals CTL2.

Each unit circuit 2 includes input terminals for receiving a set signal SU, a clock signal CK1, and a clock signal CK2, respectively, and output terminals for outputting an output signal GLOUT and an output signal OUT, respectively. The output signal GLOUT is a signal provided into the display unit 10 as a write control signal SCAN and/or an initialization control signal DIS. The output signal OUT is a signal provided as a set signal SU to a unit circuit 2 of a subsequent stage.

For the shift register 211, when the unit circuit 2s(3) is defined as the first stage, the gate clock signals GCK3 and GCK4 are provided in the following manner. To unit circuits 2 of odd-numbered stages there are provided the gate clock signal GCK3 as a clock signal CK1, and the gate clock signal GCK4 as a clock signal CK2. To unit circuits 2 of even-numbered stages there are provided the gate clock signal GCK4 as a clock signal CK1, and the gate clock signal GCK3 as a clock signal CK2. For the shift register 221, when the unit circuit 2a(0) is defined as the first stage, the gate clock signals GCK1 and GCK2 are provided in the following manner. To unit circuits 2 of odd-numbered stages there are provided the gate clock signal GCK1 as a clock signal CK1, and the gate clock signal GCK2 as a clock signal CK2. To unit circuits 2 of even-numbered stages there are provided the gate clock signal GCK2 as a clock signal CK1, and the gate clock signal GCK1 as a clock signal CK2. In addition, the gate start pulse signal GSP1 is provided to the unit circuit 2a(0) in the shift register 221.

Output signals GLOUT outputted from the unit circuits 2s(3) to 2s(n) in the shift register 211 are provided as write control signals SCAN(3) to SCAN(n) to write control lines in the third to nth rows. Output signals GLOUT outputted from the unit circuits 2a(3) to 2a(n) in the shift register 221 are provided as initialization control signals DIS(3) to DIS(n) to initialization control lines in the third to nth rows. Output signals GLOUT outputted from the unit circuits 2a(1) and 2a(2) in the shift register 221 are provided as initialization control signals DIS(1) and DIS(2) to initialization control lines in the first and second rows, and provided as write control signals SCAN(1) and SCAN(2) to write control lines in the first and second rows. In addition, an output signal OUT outputted from the unit circuit 2a(2) in the shift register 221 is provided as a set signal SU to the unit circuit 2a(3), and provided as a start pulse signal to the shift register 211 (provided as a set signal SU to the unit circuit 2s(3) in the shift register 211).

Figure 7:
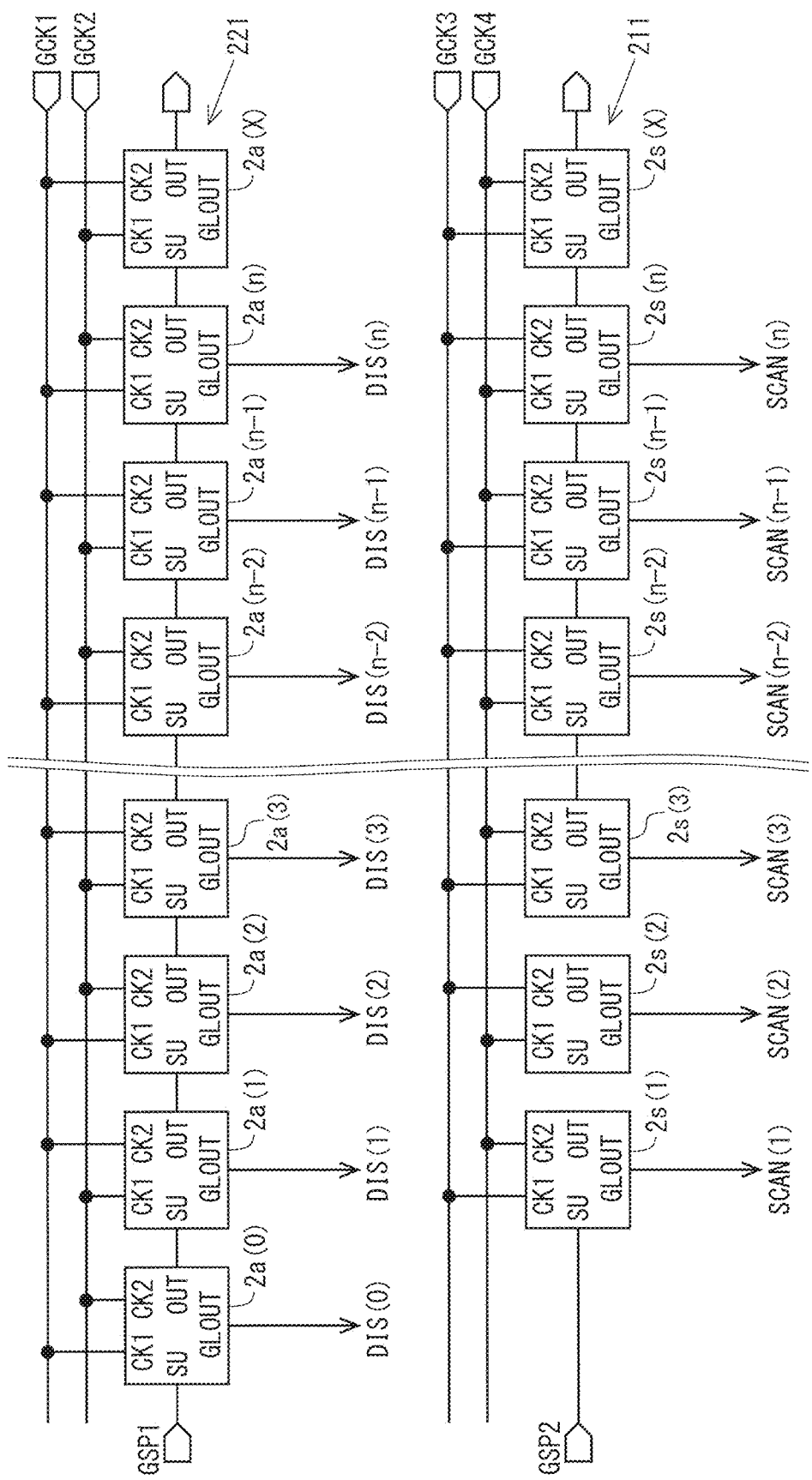
FIG. 7 is a block diagram showing configurations of a scan driver and a discharge driver of a comparative example.

Here, as a comparative example, configurations of a scan driver 210 and a discharge driver 220 for a case in which two-channel driving is performed in all regions are shown in FIG. 7. In this case, excluding dummy unit circuits, a shift register 211 included in the scan driver 210 and a shift register 221 included in the discharge driver 220 both include unit circuits 2 corresponding to the first to nth rows. On the other hand, in the present embodiment, as described above, the shift register 211 included in the scan driver 210 is not provided with unit circuits 2 corresponding to the first and second rows being the low-load region (see FIG. 1).

<1.3.2 Unit Circuits>

Figure 8:
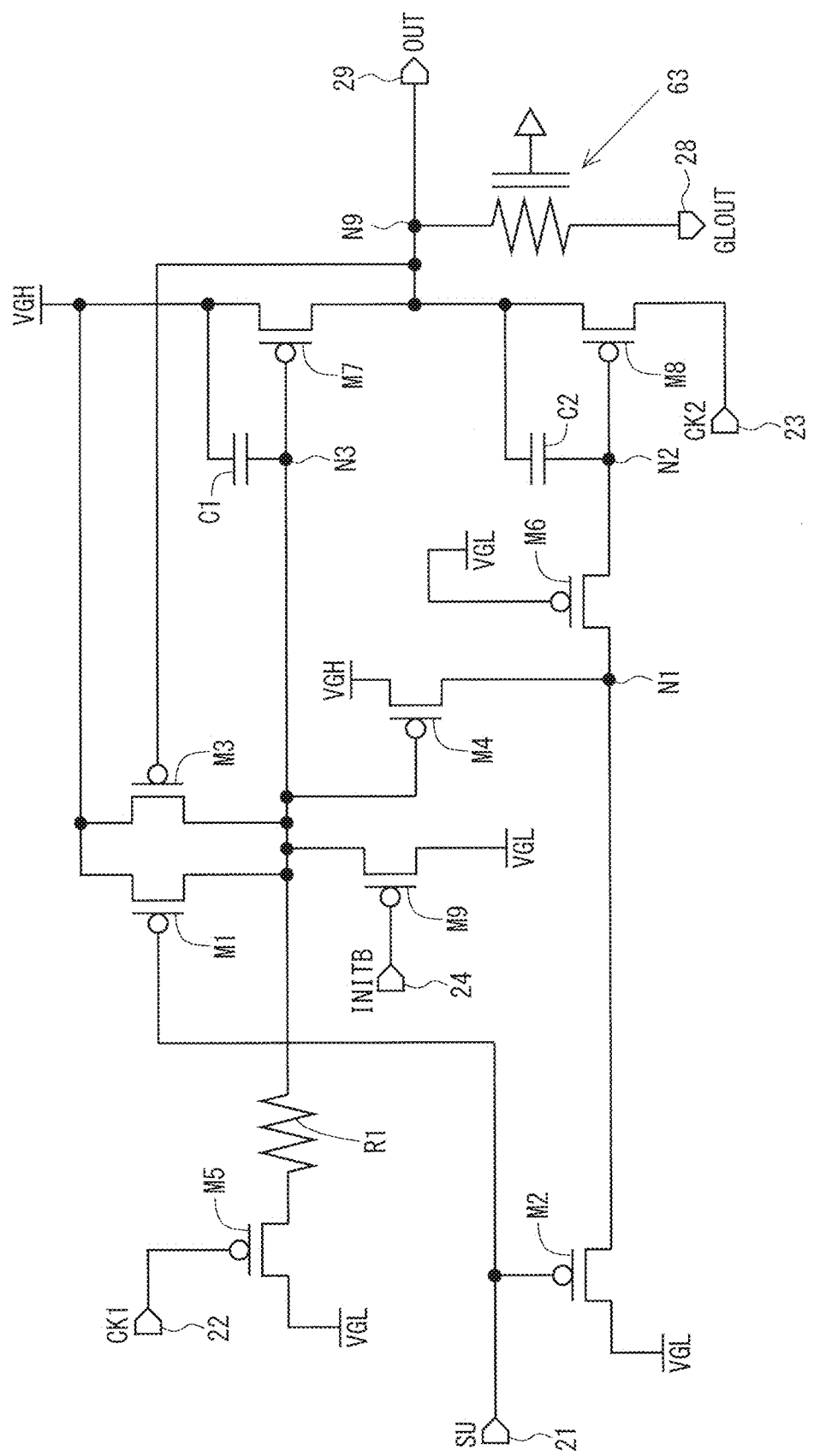
FIG. 8 is a circuit diagram showing an exemplary configuration of a unit circuit in the first embodiment.

FIG. 8 is a circuit diagram showing an exemplary configuration of a unit circuit 2 in the present embodiment. As shown in FIG. 8, the unit circuit 2 includes nine transistors M1 to M9, two capacitors C1 and C2, and one resistor R1. The transistors M1 to M9 are P-channel type transistors. The unit circuit 2 also has four input terminals 21 to 24 and two output terminals 28 and 29 in addition to an input terminal connected to a first constant potential line that supplies a gate high potential VGH, and an input terminal connected to a second constant potential line that supplies a gate low potential VGL. In FIG. 8, an input terminal for receiving a set signal SU is given reference character 21, an input terminal for receiving a clock signal CK1 is given reference character 22, an input terminal for receiving a clock signal CK2 is given reference character 23, an input terminal for receiving an initialization signal INITB is given reference character 24, an output terminal for outputting an output signal GLOUT is given reference character 28, and an output terminal for outputting an output signal OUT is given reference character 29. Note that in the following description, the output terminal for outputting the output signal GLOUT is referred to as "first output terminal" and the output terminal for outputting the output signal OUT is referred to as "second output terminal".

A second conductive terminal of the transistor M2, a first conductive terminal of the transistor M4, and a first conductive terminal of the transistor M6 are connected to each other. Note that a node where they are connected to each other is referred to as "first internal node". The first internal node is given reference character N1. A second conductive terminal of the transistor M6, a control terminal of the transistor M8, and a first electrode of the capacitor C2 are connected to each other. Note that a node where they are connected to each other is referred to as "second internal node". The second internal node is given reference character N2. A first conductive terminal of the transistor M1, a first conductive terminal of the transistor M3, a control terminal of the transistor M4, a control terminal of the transistor M7, a second conductive terminal of the transistor M9, a first electrode of the capacitor C1, and one terminal of the resistor R1 are connected to each other. Note that a node where they are connected to each other is referred to as "third internal node". The third internal node is given reference character N3. In addition, a node where the first output terminal 28 is connected to the second output terminal 29 is referred to as "output node", and the output node is given reference character N9.

The transistor M1 is connected at its control terminal to the input terminal 21, connected at its first conductive terminal to the third internal node N3, and connected at its second conductive terminal to the first constant potential line. The transistor M2 is connected at its control terminal to the input terminal 21, connected at its first conductive terminal to the second constant potential line, and connected at its second conductive terminal to the first internal node N1. The transistor M3 is connected at its control terminal to the output node N9, connected at its first conductive terminal to the third internal node N3, and connected at its second conductive terminal to the first constant potential line. The transistor M4 is connected at its control terminal to the third internal node N3, connected at its first conductive terminal to the first internal node N1, and connected at its second conductive terminal to the first constant potential line. The transistor M5 is connected at its control terminal to the input terminal 22, connected at its first conductive terminal to the second constant potential line, and connected at its second conductive terminal to the other terminal of the resistor R1. The transistor M6 is connected at its control terminal to the second constant potential line, connected at its first conductive terminal to the first internal node N1, and connected at its second conductive terminal to the second internal node N2. The transistor M7 is connected at its control terminal to the third internal node N3, connected at its first conductive terminal to the output node N9, and connected at its second conductive terminal to the first constant potential line. The transistor M8 is connected at its control terminal to the second internal node N2, connected at its first conductive terminal to the input terminal 23, and connected at its second conductive terminal to the output node N9. The transistor M9 is connected at its control terminal to the input terminal 24, connected at its first conductive terminal to the second constant potential line, and connected at its second conductive terminal to the third internal node N3. The capacitor C1 is connected at its first electrode to the third internal node N3 and connected at its second electrode to the first constant potential line. The capacitor C2 is connected at its first electrode to the second internal node N2 and connected at its second electrode to the output node N9. The resistor R1 is connected at its one terminal to the third internal node N3 and connected at its other terminal to the second conductive terminal of the transistor M5.

The initialization signal INITB which is provided to the input terminal 24 is maintained at high level upon normal operation. Thus, the transistor M9 is maintained in off state throughout a period during which normal operation is performed.

Here, the transistor M6 is taken a look at. The control terminal of the transistor M6 has the gate low potential VGL provided thereto. The gate low potential VGL is a potential having a level that maintains the transistor M6 in on state except when the potential at the first internal node N1 or the second internal node N2 is lower than a normal low level. That is, the transistor M6 is maintained in on state except when the potential at the first internal node N1 or the second internal node N2 is lower than the normal low level. The transistor M6 goes into off state when the potential at the second internal node N2 is less than or equal to a predetermined value, thereby electrically disconnecting the first internal node N1 from the second internal node N2. By this, the transistor M6 assists in a reduction in potential at the second internal node N2 occurring when the second internal node N2 goes into boost state.

Regarding the configuration shown in FIG. 8, a region indicated by an arrow given reference character 63 (a region between the output node N9 and the first output terminal 28) is a region with a relatively high wiring resistance, and since wiring in the unit circuit 2 intersects power supply wiring in the region, the load in the region is high compared with the load in a region between the output node N9 and the second output terminal 29.

<1.4 Operation>
<1.4.1 Operation of the Unit Circuit>

Figure 9:
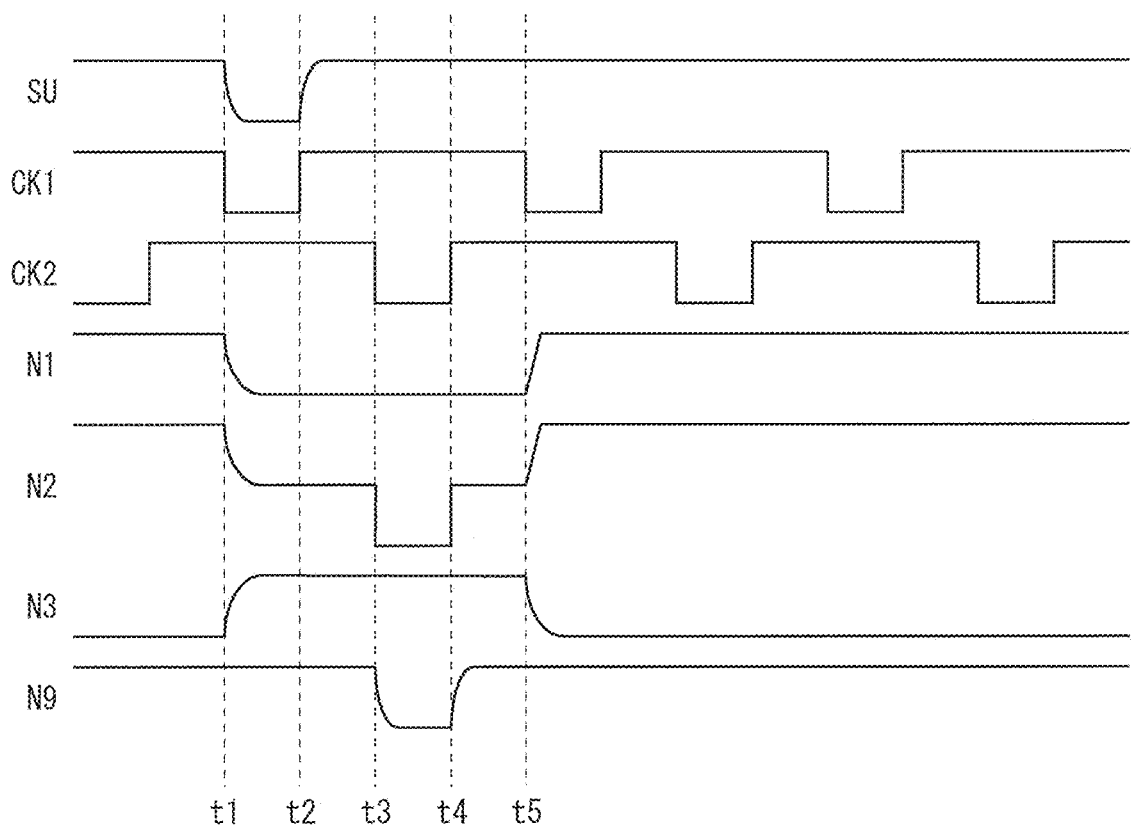
FIG. 9 is a signal waveform diagram for describing operation of the unit circuit in the first embodiment.

With reference to FIG. 9, operation of a unit circuit 2 will be described. Note that it is assumed that a period from time point t3 to time point t4 is a period during which pulses of an output signal GLOUT and an output signal OUT are to be outputted from the unit circuit 2.

During a period before time point t1, the potential at the third internal node N3 is maintained at low level and the potentials at the first internal node N1, the second internal node N2, and the output node N9 are maintained at high level.

At time point t1, the set signal SU changes from high level to low level. By this, the transistor M2 goes into on state, and the potentials at the first internal node N1 and the second internal node N2 decrease. As a result, the transistor M8 goes into on state. However, during a period from time point t1 to time point t2, since the clock signal CK2 is maintained at high level, the potential at the output node N9 (i.e., the potentials of the output signals GLOUT and OUT) is maintained at high level. In addition, at time point t1, the transistor M1 goes into on state and thus the potential at the third internal node N3 increases.

During a period from time point t2 to time point t3, as with the period from time point t1 to time point t2, the clock signal CK2 is maintained at high level. Thus, during the period from time point t2 to time point t3, the potential at the output node N9 is maintained at high level.

At time point t3, the clock signal CK2 changes from high level to low level. At this time, the transistor M8 is in on state, and thus, with a reduction in potential at the input terminal 23, the potential at the output node N9 decreases. Here, the capacitor C2 is provided between the second internal node N2 and the output node N9, and thus, with a reduction in potential at the output node N9, the potential at the second internal node N2 also decreases. As a result, a large negative voltage is applied to the control terminal of the transistor M8, and the potential at the output node N9 sufficiently decreases. Note that during a period from time point t3 to time point t4, the transistor M6 goes into off state and the potential at the first internal node N1 is maintained at the potential obtained before time point t3.

At time point t4, the clock signal CK2 changes from low level to high level. By this, with an increase in potential at the input terminal 23, the potential at the output node N9 increases. When the potential at the output node N9 increases, the potential at the second internal node N2 also increases through the capacitor C2. By this, the transistor M6 goes into on state.

At time point t5, the clock signal CK1 changes from high level to low level. By this, the transistor M5 goes into on state and the potential at the third internal node N3 decreases. By the reduction in potential at the third internal node N3, the transistor M4 goes into on state. As a result, the potential at the first internal node N1 increases. At this time, the transistor M6 is in on state, and thus, the potential at the second internal node N2 also increases.

During a period after time point t5, as with the period before time point t1, the potential at the third internal node N3 is maintained at low level and the potentials at the first internal node N1, the second internal node N2, and the output node N9 are maintained at high level.

<1.4.2 Overall Operation>

Figure 10:
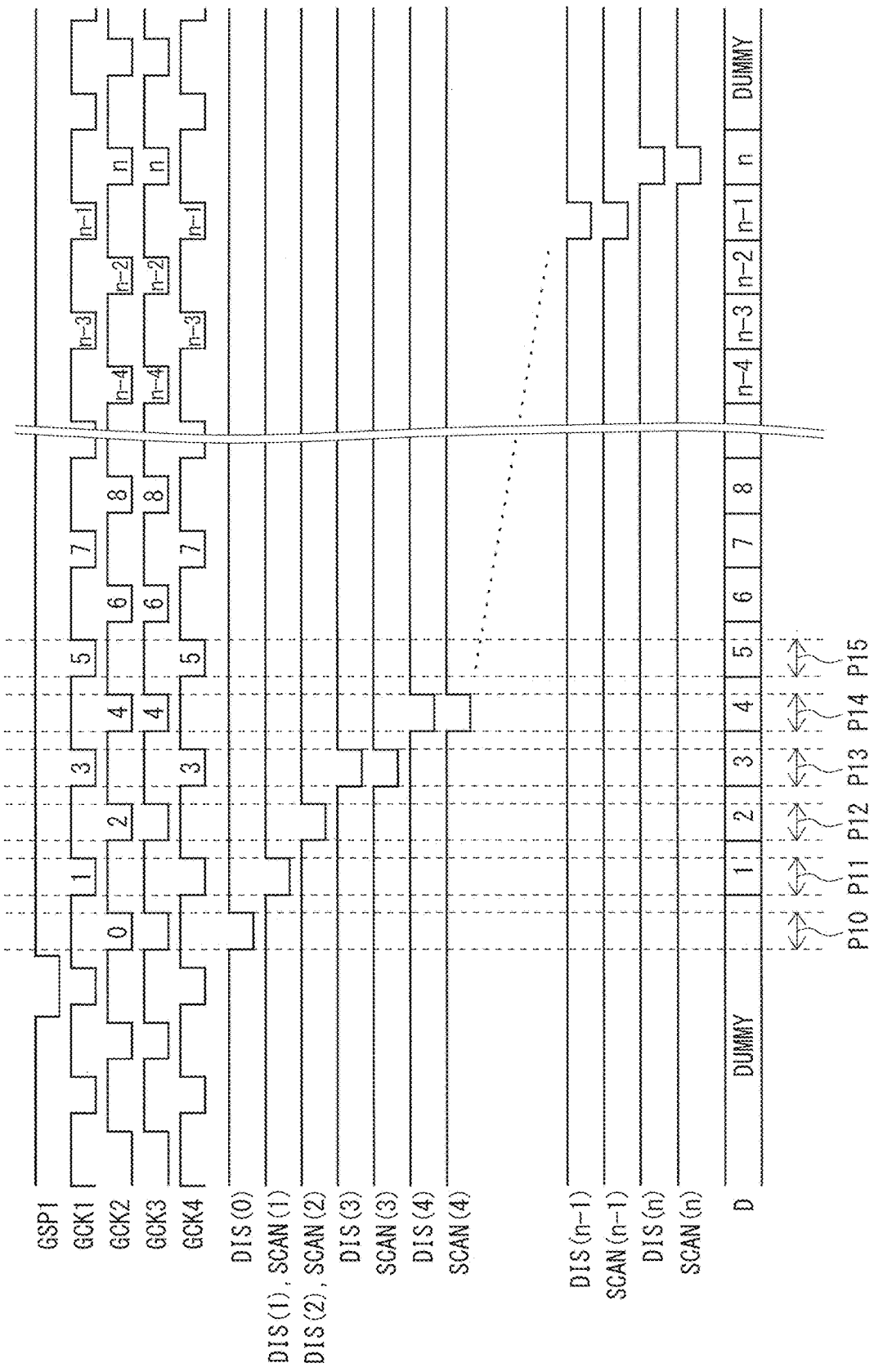
FIG. 10 is a signal waveform diagram for describing overall operation in the first embodiment.

Considering the operation of the unit circuits 2, overall operation will be described with reference to FIG. 10. Note that for FIG. 10, of the pulses of gate clock signals GCK1 to GCK4, those pulses given numerical values, etc., are pulses that directly contribute to output of pulses of write control signals SCAN or initialization control signals DIS from unit circuits 2. For example, of the pulses of the gate clock signal GCK1, a pulse given the numerical value "3" is a pulse that contributes to output of a pulse of an initialization control signal DIS(3), of the pulses of the gate clock signal GCK3, a pulse given the numerical value "4" is a pulse that contributes to output of a pulse of a write control signal SCAN(4), and of the pulses of the gate clock signal GCK1, a pulse given the numerical value "1" is a pulse that contributes to output of pulses of an initialization control signal DIS(1) and a write control signal SCAN(1). In addition, a numerical value, etc., in a data signal D field indicates which row's data the data signal D corresponds to.

After outputting a pulse of a gate start pulse signal GSP1, during a period P10, a pulse of an output signal GLOUT is outputted from the unit circuit 2a(0), based on a pulse of the gate clock signal GCK2. That is, during the period P10, a pulse of an initialization control signal DIS(0) for a dummy is outputted.

During a period P11, a pulse of an output signal GLOUT is outputted from the unit circuit 2a(1), based on a pulse of the gate clock signal GCK1. As described above, the output signal GLOUT outputted from the unit circuit 2a(1) is provided as an initialization control signal DIS(1) to an initialization control line in the first row and provided as a write control signal SCAN(1) to a write control line in the first row. Thus, during the period P11, pulses of the initialization control signal DIS(1) and the write control signal SCAN(1) are outputted.

During a period P12, a pulse of an output signal GLOUT is outputted from the unit circuit 2a(2), based on a pulse of the gate clock signal GCK2. As described above, the output signal GLOUT outputted from the unit circuit 2a(2) is provided as an initialization control signal DIS(2) to an initialization control line in the second row and provided as a write control signal SCAN(2) to a write control line in the second row. Thus, during the period P12, pulses of the initialization control signal DIS(2) and the write control signal SCAN(2) are outputted.

During a period P13, a pulse of an output signal GLOUT is outputted from the unit circuit 2a(3), based on a pulse of the gate clock signal GCK1. As described above, the output signal GLOUT outputted from the unit circuit 2a(3) is provided as an initialization control signal DIS(3) to an initialization control line in the third row. Thus, during the period P13, a pulse of the initialization control signal DIS(3) is outputted. In addition, as described above, an output signal OUT outputted from the unit circuit 2a(2) is provided as a start pulse signal to the shift register 211 (provided as a set signal SU to the unit circuit 2s(3) in the shift register 211). By this, during the period P13, a pulse of an output signal GLOUT is outputted from the unit circuit 2s(3), based on a pulse of the gate clock signal GCK4. Thus, during the period P13, a pulse of a write control signal SCAN(3) is outputted.

During a period P14, a pulse of an output signal GLOUT is outputted from the unit circuit 2a(4), based on a pulse of the gate clock signal GCK2. As described above, the output signal GLOUT outputted from the unit circuit 2a(4) is provided as an initialization control signal DIS(4) to an initialization control line in the fourth row. Thus, during the period P14, a pulse of the initialization control signal DIS(4) is outputted. In addition, during the period P14, a pulse of an output signal GLOUT is outputted from the unit circuit 2s(4), based on a pulse of the gate clock signal GCK3. As described above, the output signal GLOUT outputted from the unit circuit 2s(4) is provided as a write control signal SCAN(4) to a write control line in the fourth row. Thus, during the period P14, a pulse of the write control signal SCAN(4) is outputted.

During a period P15 and subsequent periods, a pulse of an initialization control signal DIS is outputted from a unit circuit 2 in the shift register 221, based on a pulse of the gate clock signal GCK1 or the gate clock signal GCK2, and a pulse of a write control signal SCAN is outputted from a unit circuit 2 in the shift register 211, based on a pulse of the gate clock signal GCK3 or the gate clock signal GCK4.

As above, during the periods P11 and P12, initialization control lines DIS and write control lines SCAN are driven by one-channel driving, and during the period P13 and subsequent periods, initialization control lines DIS and write control lines SCAN are driven by two-channel driving. That is, one-channel driving is performed in the low-load region and two-channel driving is performed in the high-load region.

<1.5 Effect>

According to the present embodiment, the display unit 10 of the organic EL display device has a non-rectangular shape. Write control lines SCAN disposed in the high-load region and initialization control lines DIS disposed in the high-load region are driven by the scan driver 210 and the discharge driver 220, respectively, and write control lines SCAN disposed in the low-load region and initialization control lines DIS disposed in the low-load region both are driven by the discharge driver 220. As such, regarding horizontal scanning lines disposed in the low-load region, when taking a look at each row, two horizontal scanning lines (a write control line SCAN and an initialization control line DIS) are driven by one driver. Hence, abrupt changes in the waveforms of control signals that are provided to the horizontal scanning lines disposed in the low-load region are suppressed. As a result, differential delay in changes in the waveforms of control signals between the low-load region and the high-load region decreases over known display devices, suppressing occurrence of a difference in luminance between the low-load region and the high-load region. As above, according to the present embodiment, the organic EL display device having the non-rectangular display unit 10 can suppress occurrence of a difference in luminance between the low-load region and the high-load region.

Figure 11:
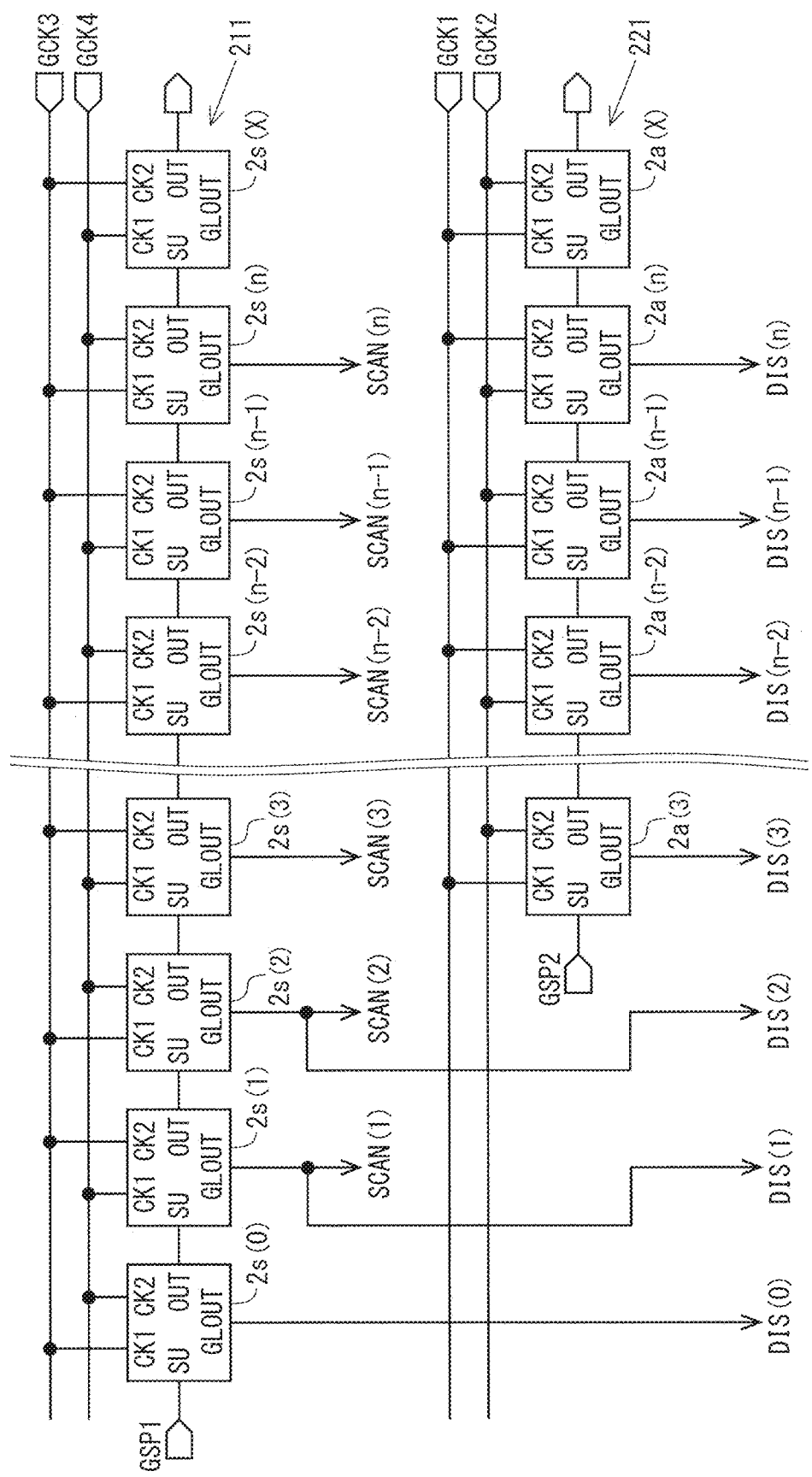
FIG. 11 is a block diagram showing configurations of a scan driver and a discharge driver in a first variant of the first embodiment.

<1.6 Variants>
Variants of the first embodiment will be described below.
<1.6.1 First Variant>
FIG. 11 is a block diagram showing configurations of a scan driver 210 and a discharge driver 220 in a first variant of the first embodiment. In the first embodiment, the shift register 211 included in the scan driver 210 is not provided with unit circuits 2 corresponding to the first and second rows being the low-load region. On the other hand, in the present variant, as can be grasped from FIG. 11, a shift register 221 included in the discharge driver 220 is not provided with unit circuits 2 corresponding to the first and second rows being the low-load region.

In addition, in the present variant, unlike the first embodiment, two gate start pulse signals GSP1 and GSP2 are used. That is, gate start pulse signals of different waveforms are provided to a shift register 211 included in the scan driver 210 and the shift register 221 included in the discharge driver 220.

Figure 12:
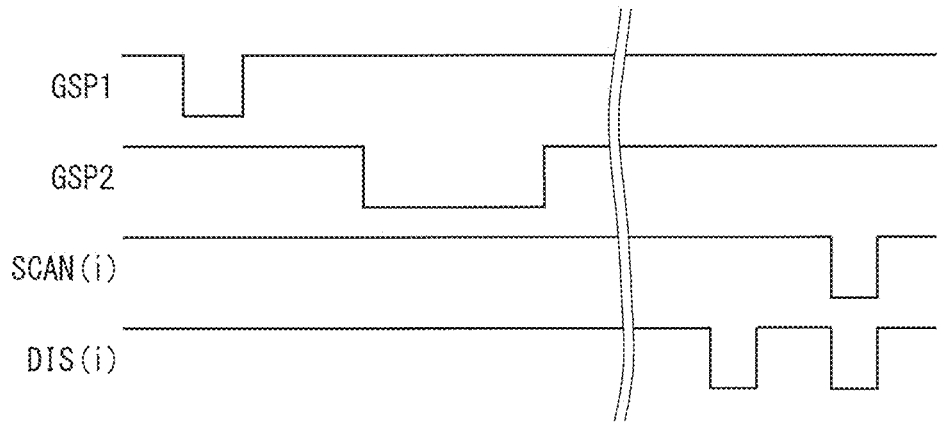
FIG. 12 is a signal waveform diagram of a gate start pulse signal, etc., in the first variant of the first embodiment.

In the present variant, for example, as shown in FIG. 12, the pulse width of the gate start pulse signal GSP2 which is provided to the shift register 221 is longer than the pulse width of the gate start pulse signal GSP1 which is provided to the shift register 211. By this, it is possible to generate a plurality of pulses of an initialization control signal DIS per one driving of the initialization control line (see FIG. 12). As a result, the time to initialize the internal state of a pixel circuit 100 is sufficiently secured.

<1.6.2 Second Variant>
In the first embodiment, all unit circuits 2 constituting the shift registers are provided with two output terminals 28 and 29 (see FIGS. 1 and 8). On the other hand, in the present variant, unit circuits 2 that adopt one-channel driving are provided with only one output terminal. This configuration will be described below.

Figure 13:
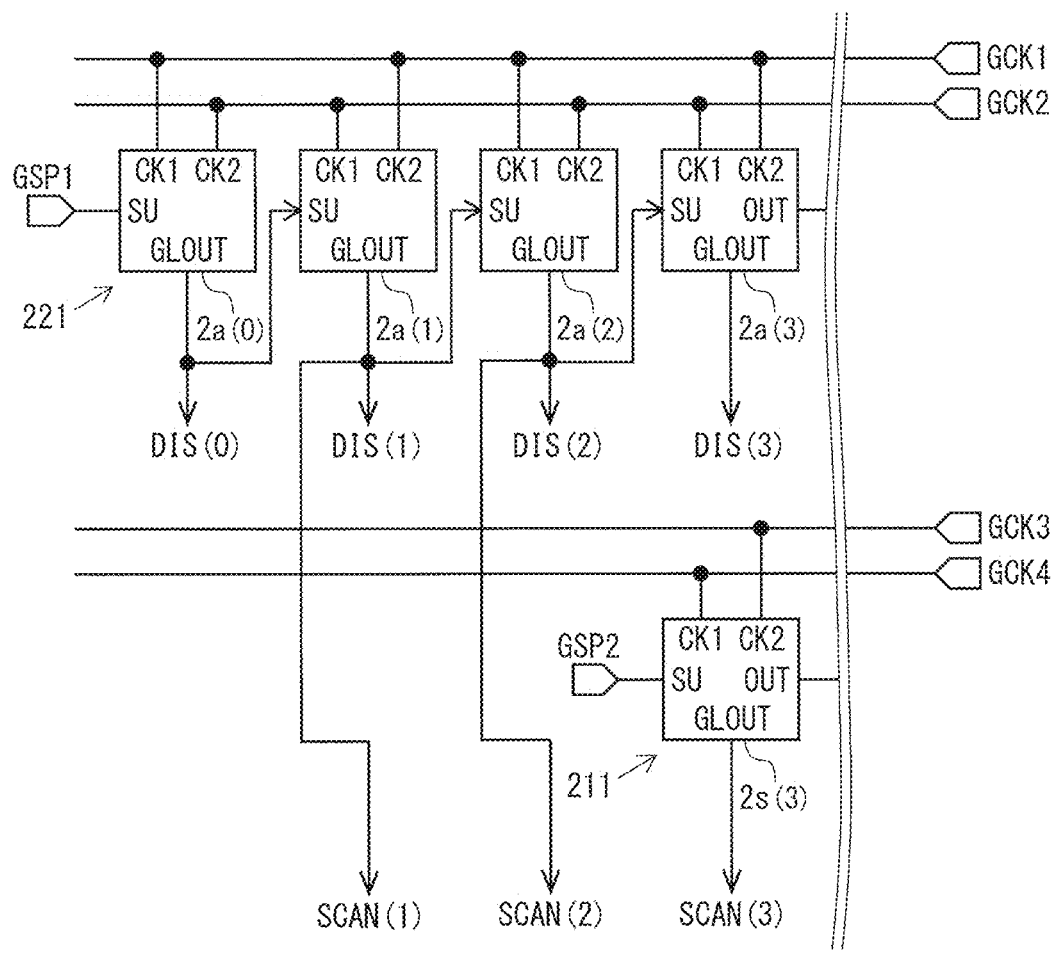
FIG. 13 is a block diagram showing configurations of a scan driver and a discharge driver in a second variant of the first embodiment.

FIG. 13 is a diagram for describing configurations of a scan driver 210 and a discharge driver 220 in the present variant. As shown in FIG. 13, regarding a shift register 221 included in the discharge driver 220, a dummy unit circuit 2a(0) on an input-end side and unit circuits 2a(1) and 2a(2) corresponding to the first and second rows are provided with an output terminal for outputting an output signal GLOUT, but are not provided with an output terminal for outputting an output signal OUT. An output signal GLOUT outputted from the unit circuit 2a(0) is provided as an initialization control signal DIS(0) to an initialization control line for a dummy, and provided as a set signal SU to the unit circuit 2a(1) of a subsequent stage. An output signal GLOUT outputted from the unit circuit 2a(1) is provided as an initialization control signal DIS(1) to an initialization control line in the first row, provided as a write control signal SCAN(1) to a write control line in the first row, and provided as a set signal SU to the unit circuit 2a(2) of a subsequent stage. An output signal GLOUT outputted from the unit circuit 2a(2) is provided as an initialization control signal DIS(2) to an initialization control line in the second row, provided as a write control signal SCAN(2) to a write control line in the second row, and provided as a set signal SU to a unit circuit 2a(3) of a subsequent stage.

Figure 14:
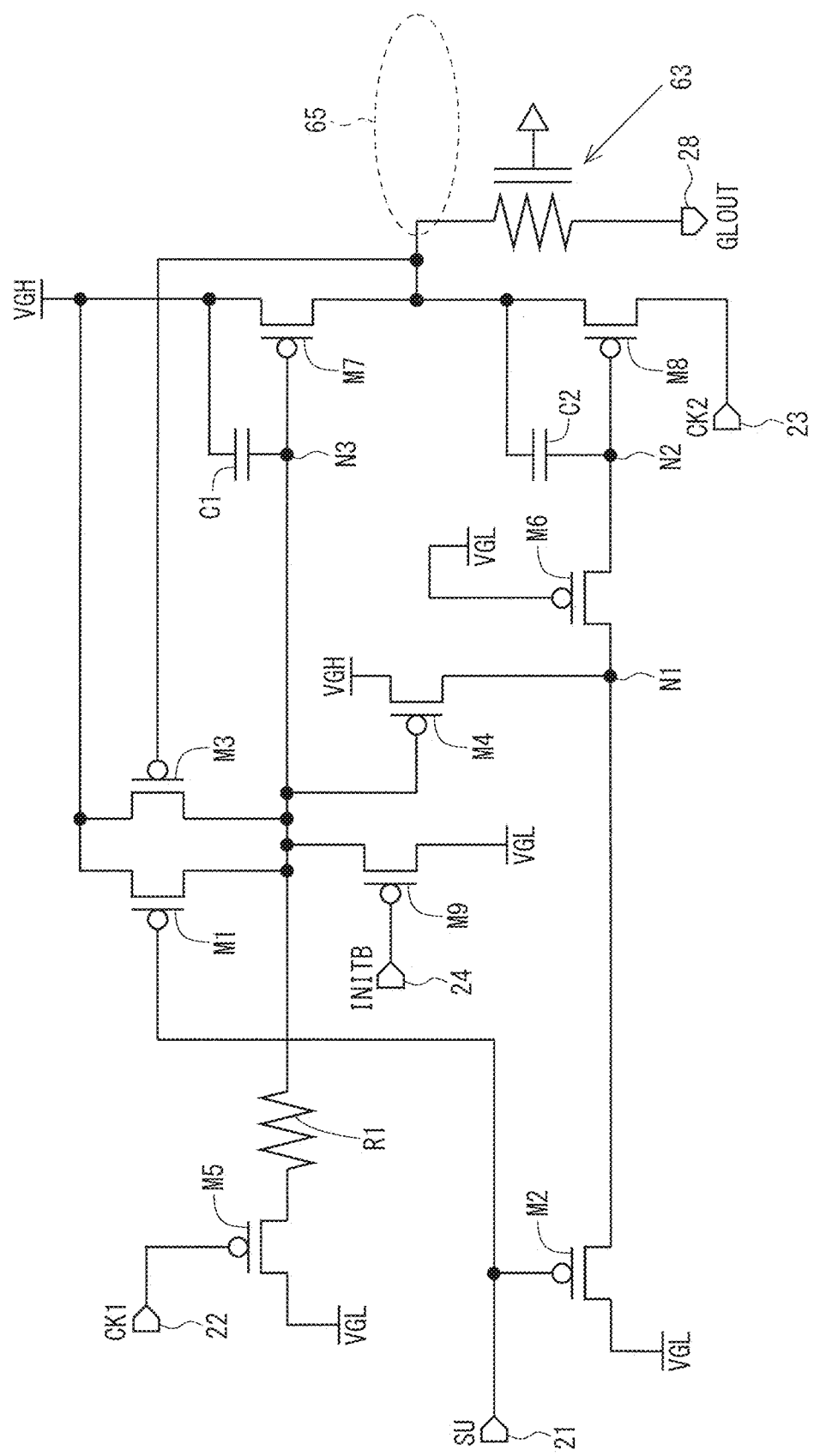
FIG. 14 is a circuit diagram showing a configuration of a unit circuit that adopts one-channel driving in the second variant of the first embodiment.

FIG. 14 is a circuit diagram showing a configuration of a unit circuit 2 that adopts one-channel driving in the present variant. As can be grasped from a portion given reference character 65 in FIG. 14, the unit circuit 2 that adopts one-channel driving is not provided with an output terminal 29 that outputs an output signal OUT, unlike other unit circuits 2 (unit circuits 2 that adopt two-channel driving) (see FIG. 8).

According to a configuration such as that described above, a unit circuit 2 corresponding to the low-load region outputs, through one output terminal 28, control signals that are provided to horizontal scanning lines (a write control line SCAN and an initialization control line DIS) and a control signal that is provided as a set signal SU to a unit circuit 2 of a subsequent stage. Hence, changes in the waveforms of control signals that are provided to horizontal scanning lines disposed in the low-load region are mild compared with those of the first embodiment. By this, occurrence of a difference in luminance between the low-load region and the high-load region is effectively suppressed. In addition, unit circuits 2 that adopt one-channel driving are not provided with an output terminal 29 that outputs an output signal OUT unlike the first embodiment, and thus, an effect of reducing a picture-frame can also be obtained.

<1.6.3 Third Variant>
In the first embodiment, all write control lines SCAN and all initialization control lines DIS are driven from both of the one-edge side and other-edge side of the display unit 10. On the other hand, in the present variant, write control lines SCAN and initialization control lines DIS that are disposed in the high-load region are driven from both of the one-edge side and other-edge side of the display unit 10, and write control lines SCAN and initialization control lines DIS that are disposed in the low-load region are driven from only one of the one-edge side and other-edge side of the display unit 10.

Figure 15:
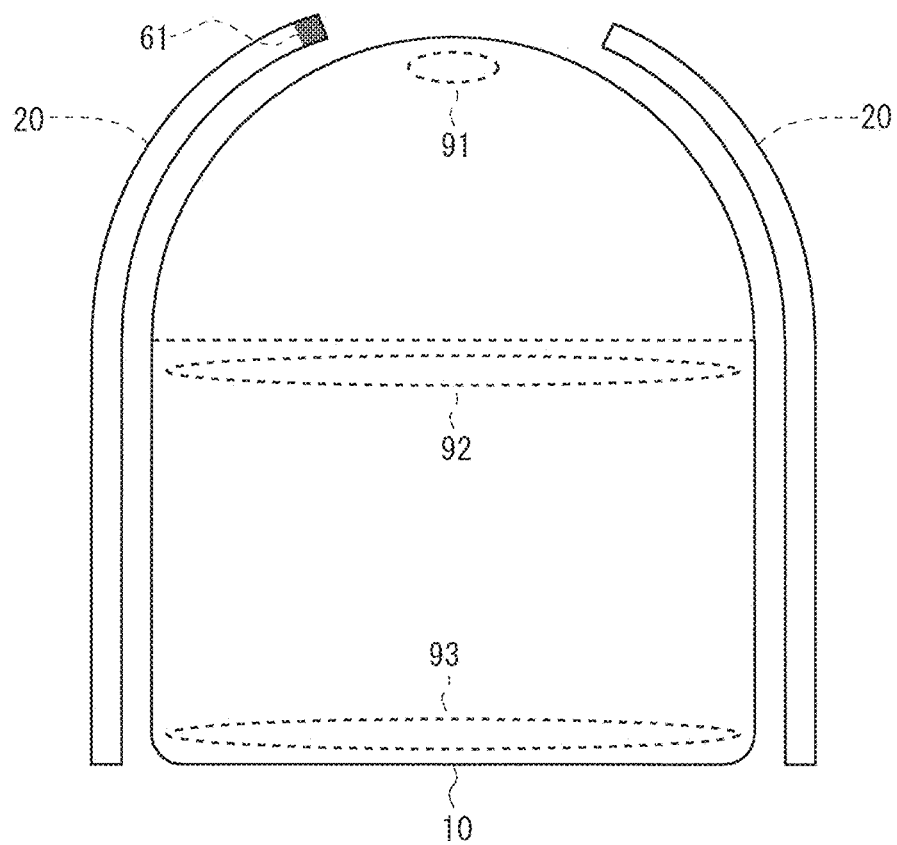
FIG. 15 is a schematic plan view of an organic EL display device of a third variant of the first embodiment.

FIG. 15 is a schematic plan view of an organic EL display device of the present variant. Regarding FIG. 15, a panel driving unit 20 provided on the left side of a display unit 10 has components that adopt one-channel driving. On the other hand, a panel driving unit 20 provided on the right side of the display unit 10 does not have components that adopt one-channel driving. That is, shift registers 211 and 221 in the panel driving unit 20 provided on the right side of the display unit 10 are not provided with unit circuits 2 corresponding to the first and second rows.

According to a configuration such as that described above, as in the second variant, changes in the waveforms of control signals that are provided to horizontal scanning lines disposed in the low-load region are mild compared with those of the first embodiment. By this, occurrence of a difference in luminance between the low-load region and the high-load region is effectively suppressed. In addition, the number of unit circuits 2 can be reduced compared with that of the first embodiment, and thus, as in the second variant, an effect of reducing a picture-frame can also be obtained.

Figure 16:
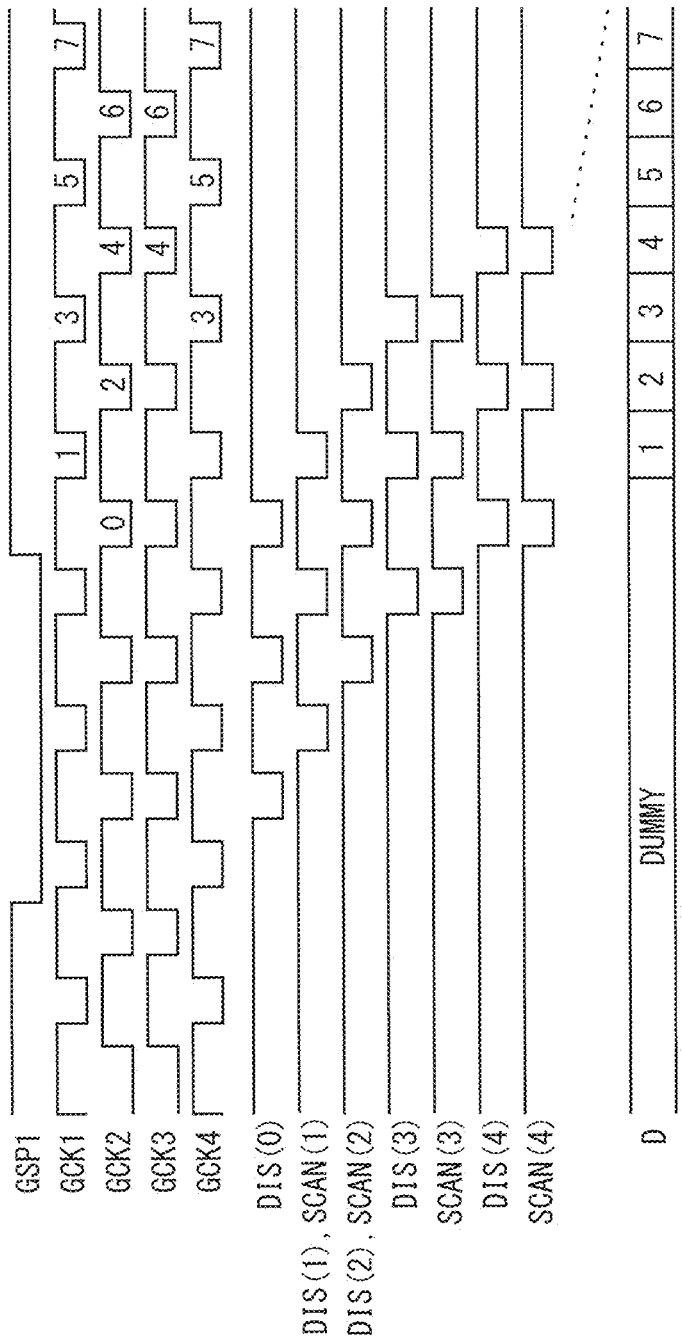
FIG. 16 is a signal waveform diagram for describing overall operation in a fourth variant of the first embodiment.

<1.6.4 Fourth Variant>
FIG. 16 is a signal waveform diagram for describing overall operation in a fourth variant of the first embodiment. In the present variant, the pulse width of a gate start pulse signal GSP1 is longer than that of the first embodiment. Hence, three pulses of each of a write control signal SCAN and an initialization control signal DIS are generated per one driving of the write control line and the initialization control line. Note that configurations of a scan driver 210 and a discharge driver 220 are the same as those of the first embodiment (see FIG. 1).

As above, in the present variant, the gate start pulse signal GSP1 and gate clock signals GCK1 and GCK2 are provided to the shift register 221 and gate clock signals GCK3 and GCK4 are provided to the shift register 211 such that a plurality of consecutive pulses are outputted as an output signal from each unit circuit 2 included in shift registers 211 and 221. In this manner, the configuration may be such that a plurality of pulses of each of a write control signal SCAN and an initialization control signal DIS are generated per one driving of the write control line and the initialization control line.

<1.6.5 Fifth Variant>

Figure 17:
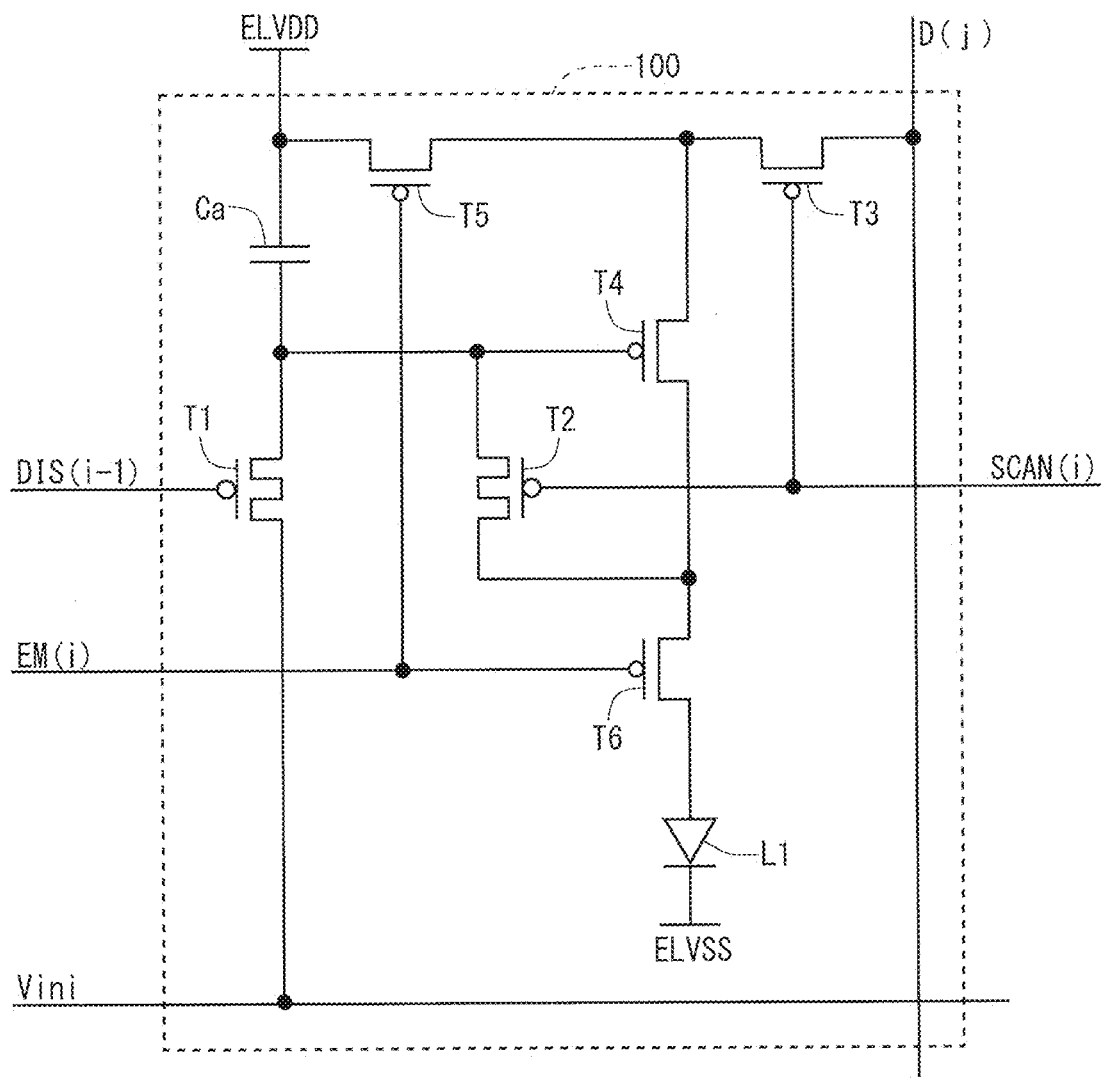
FIG. 17 is a circuit diagram showing a configuration of a pixel circuit in an ith row and a jth column in a fifth variant of the first embodiment.

In the first embodiment, a pixel circuit 100 having the configuration shown in FIG. 6 is used. On the other hand, in the present variant, a pixel circuit 100 having a configuration shown in FIG. 17 is used. Also in a case in which the pixel circuit 100 having such a configuration is used, regarding driving of horizontal scanning lines (a write control line SCAN and an initialization control line DIS), a scheme can be adopted in which two-channel driving is performed in the high-load region and one-channel driving is performed in the low-load region.

<1.6.6 Regarding the First to Fifth Variants>

The first to fourth variants each can also be applied to other embodiments or other variants. The fifth variant can also be applied to a second embodiment or other variants.

2. Second Embodiment

<2.1 Overall Configuration>

Figure 18:
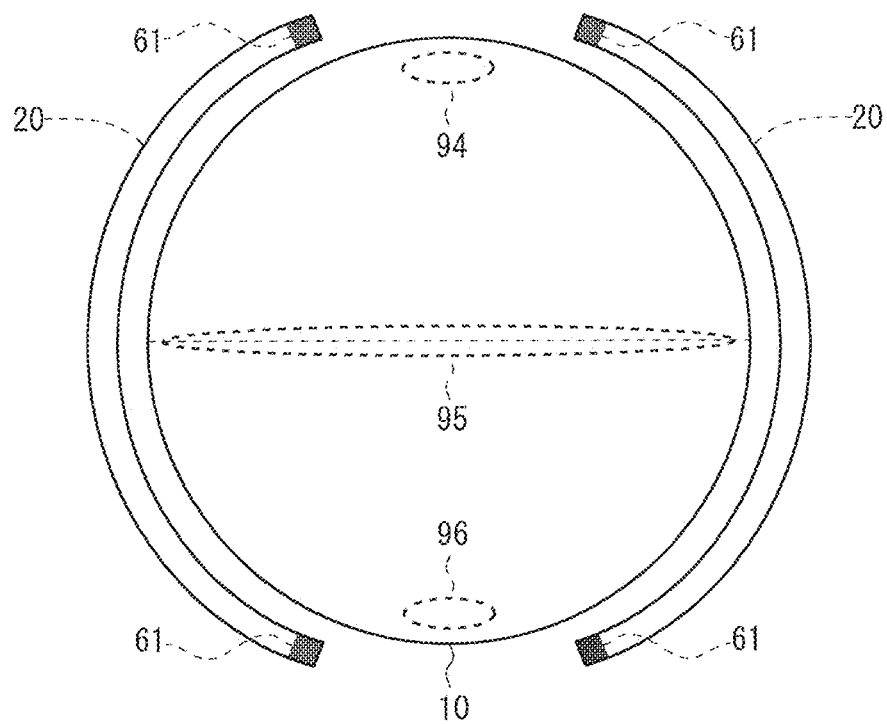
FIG. 18 is a schematic plan view of an organic EL display device of a second embodiment.
Figure 28:
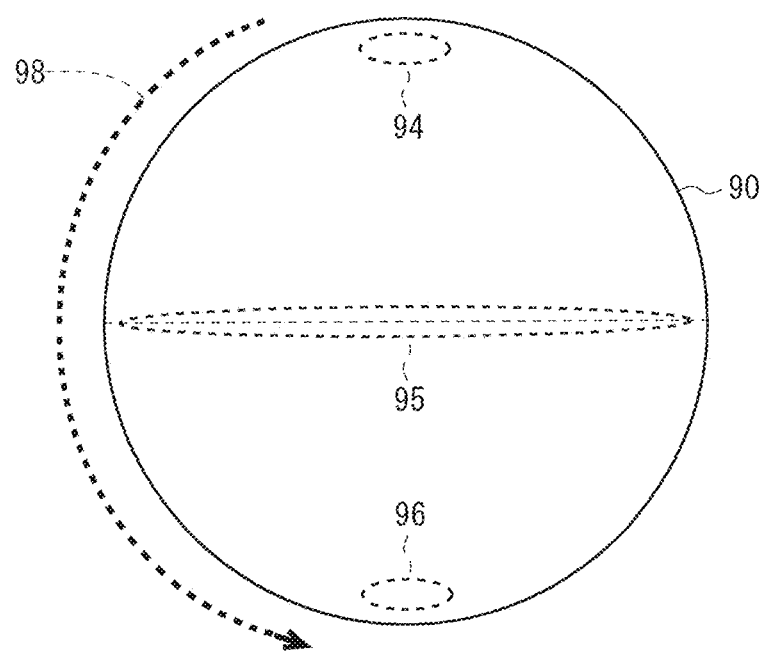
FIG. 28 is a diagram showing another example of a display unit of an odd-shaped display in a known example.
Figure 29:
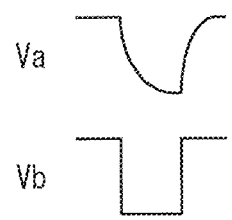
FIG. 29 is a signal waveform diagram for describing changes in the waveforms of control signals in a known example.

FIG. 18 is a schematic plan view of an organic EL display device of a second embodiment. In the present embodiment, a display unit 10 has a circular shape as with the display unit 90 shown in FIG. 28. Regions given reference characters 94 and 96 in FIG. 18, correspond to low-load regions. That is, in the present embodiment, a vicinity of a one-edge portion and a vicinity of an other-edge portion in a vertical scanning direction with reference to the center of the display unit 10 in the region of the display unit 10 are segmented as low-load regions. In the low-load regions, one-channel driving is performed, and in a region other than the low-load regions (i.e., in a high-load region), two-channel driving is performed. Thus, for both of the left side of the display unit 10 and the right side of the display unit 10, a portion 61 having components that adopt one-channel driving is present on both of an upper side and a lower side.

<2.2 Configurations of a Scan Driver and a Discharge Driver>

Figure 19:
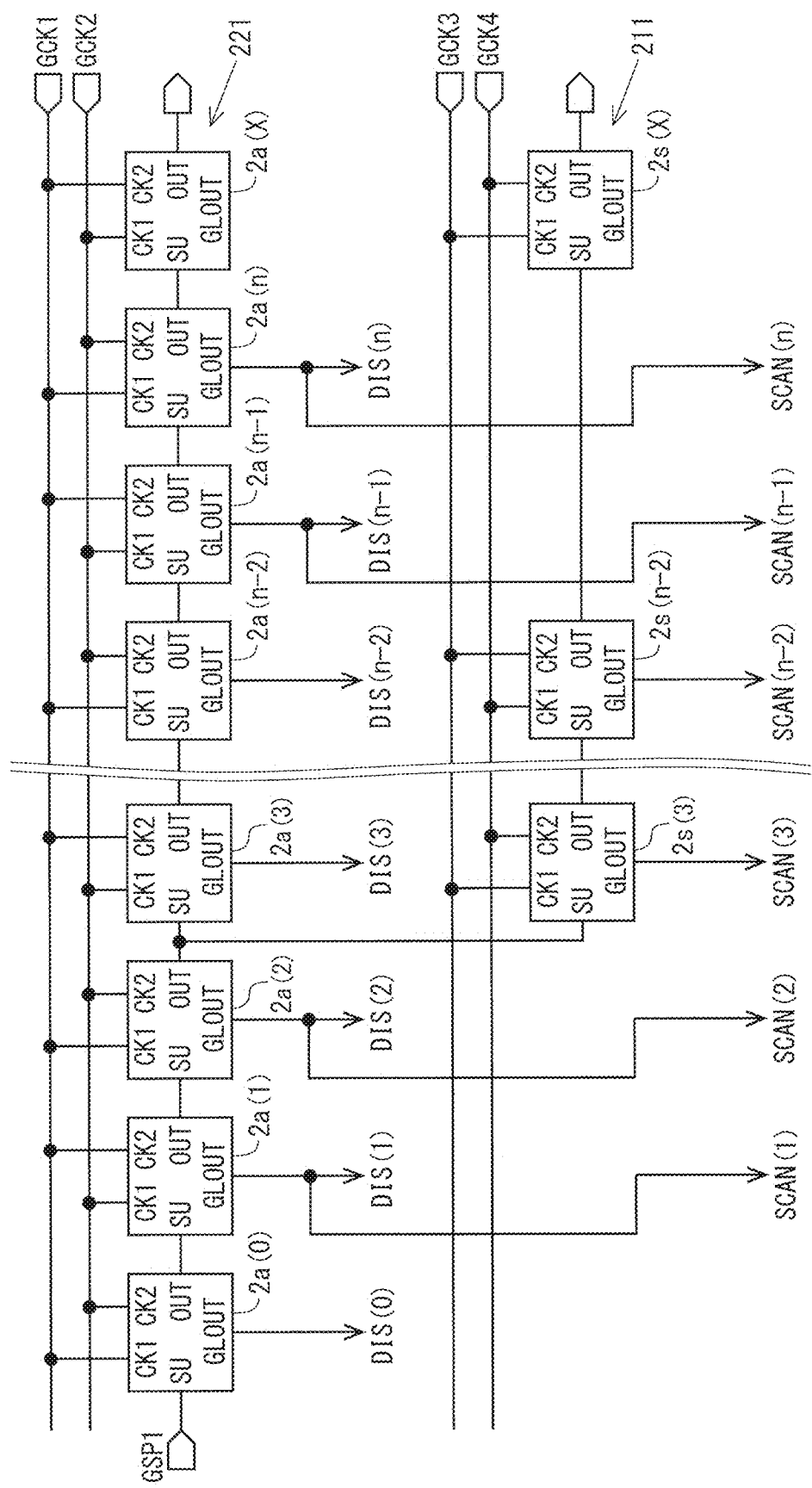
FIG. 19 is a block diagram showing configurations of a scan driver and a discharge driver in the second embodiment.

FIG. 19 is a block diagram showing configurations of a scan driver 210 and a discharge driver 220. In the present embodiment, the first and second rows and the (n−1)th and nth rows correspond to low-load regions, and the third to (n−2)th rows correspond to a high-load region. As in the first embodiment, a shift register 221 included in the discharge driver 220 are provided with unit circuits 2 for all rows. A shift register 211 included in the scan driver 210 is not provided with unit circuits 2 corresponding to the first and second rows and unit circuits 2 corresponding to the (n−1)th and nth rows. That is, in the present embodiment, excluding unit circuits 2 that do not contribute to display, the shift register 211 includes only unit circuits $2s(3)$ to $2s(n-2)$ corresponding to the third to (n−2)th rows being the high-load region. The configuration and operation of the unit circuits 2 are the same as those of the first embodiment.

<2.3 Overall Operation>

Figure 20:
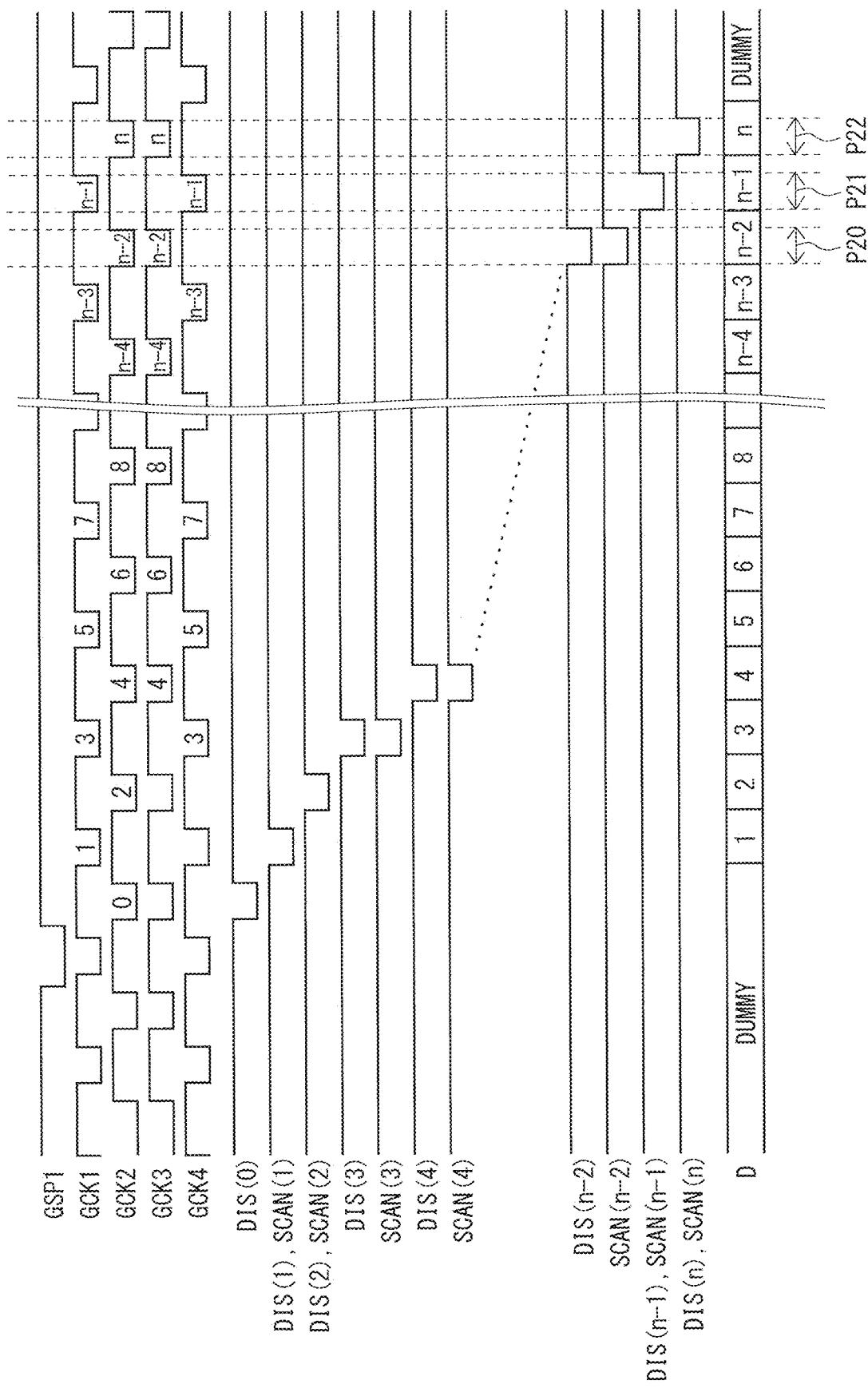
FIG. 20 is a signal waveform diagram for describing overall operation in the second embodiment.

FIG. 20 is a signal waveform diagram for describing overall operation in the present embodiment. During periods before a period P20, the same operation as that of the first embodiment is performed. Note that during the period P20, an initialization control line DIS and a write control line SCAN are driven by two-channel driving.

During a period P21, a pulse of an output signal GLOUT is outputted from a unit circuit $2a(n-1)$, based on a pulse of a gate clock signal GCK1. The output signal GLOUT outputted from the unit circuit $2a(n-1)$ is provided as an initialization control signal DIS(n−1) to an initialization control line in the (n−1)th row, and provided as a write control signal SCAN(n−1) to a write control line in the (n−1)th row. Thus, during the period P21, pulses of the initialization control signal DIS(n−1) and the write control signal SCAN(n−1) are outputted.

During a period P22, a pulse of an output signal GLOUT is outputted from a unit circuit $2a(n)$, based on a pulse of a gate clock signal GCK2. The output signal GLOUT outputted from the unit circuit $2a(n)$ is provided as an initialization control signal DIS(n) to an initialization control line in the nth row, and provided as a write control signal SCAN(n) to a write control line in the nth row. Thus, during the period P22, pulses of the initialization control signal DIS(n) and the write control signal SCAN(n) are outputted.

In the above-described manner, one-channel driving is performed for horizontal scanning lines in the first and second rows, two-channel driving is performed for horizontal scanning lines in the third to (n−2)th rows, and one-channel driving is performed for horizontal scanning lines in the (n−1)th and nth rows. As such, as in the first embodiment, in the present embodiment, too, one-channel driving is performed in the low-load regions and two-channel driving is performed in the high-load region.

<2.4 Effect>

According to the present embodiment, in the organic EL display device having the circular display unit 10, as in the first embodiment, occurrence of a difference in luminance between the low-load regions and the high-load region can be suppressed.

3. Third Embodiment

<3.1 Overall Configuration>

Figure 21:
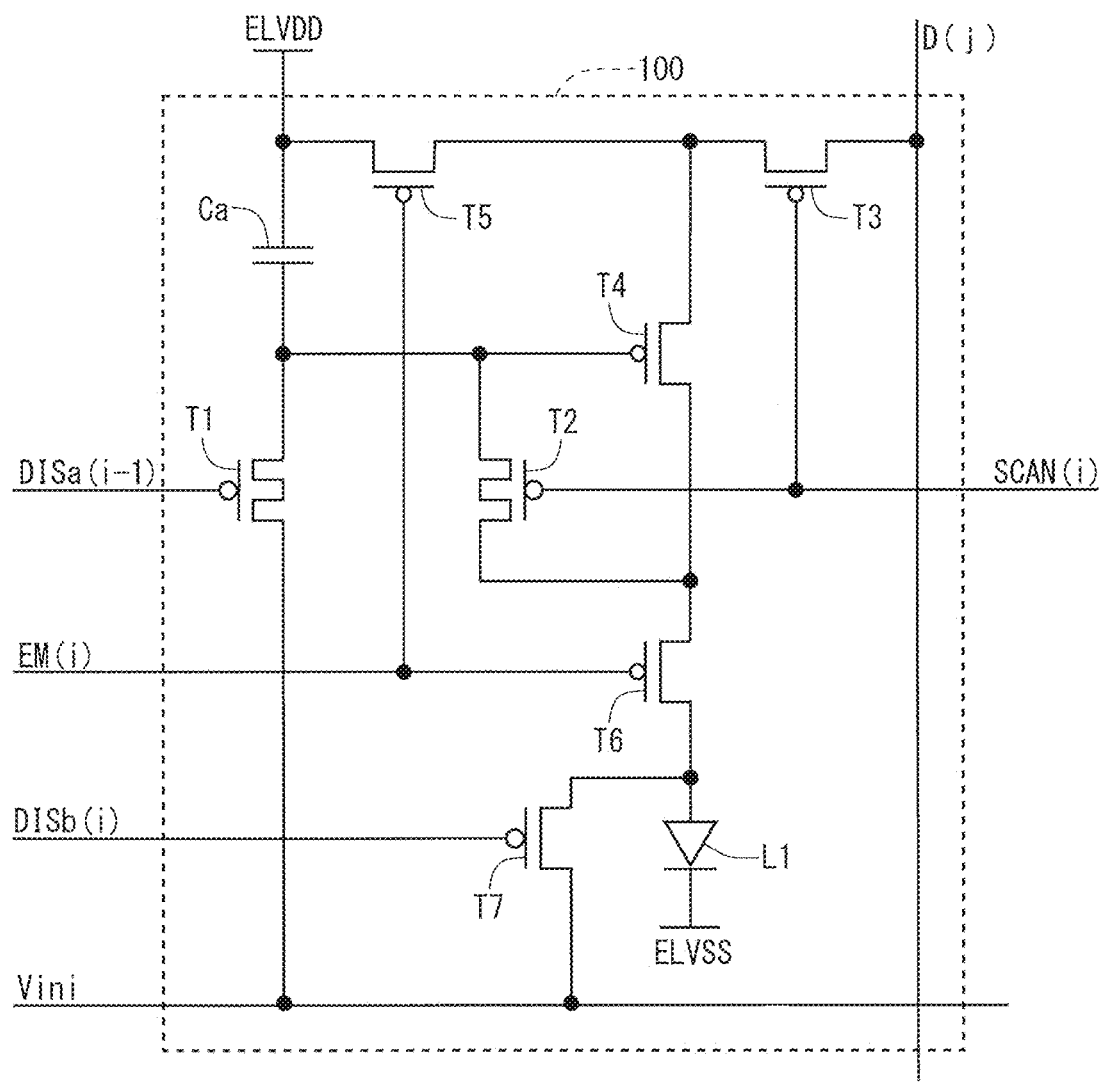
FIG. 21 is a circuit diagram showing a configuration of a pixel circuit in an ith row and a jth column in a third embodiment.

A display unit 10 of an organic EL display device according to the present embodiment has a shape obtained by combining a semicircle and a rectangle, as in the first embodiment (see FIG. 2). In the present embodiment, unlike the first embodiment, first initialization control lines DISa and second initialization control lines DISb are disposed as initialization control lines in the display unit 10. FIG. 21 is a circuit diagram showing a configuration of a pixel circuit 100 in an ith row and a jth column in the present embodiment. As can be grasped from FIG. 21, a control terminal of a first initialization transistor T1 is connected to a first initialization control line DISa(i−1) in an (i−1)th row, and a control terminal of a second initialization transistor T7 is connected to a second initialization control line DISb(i) in the ith row.

Figure 22:
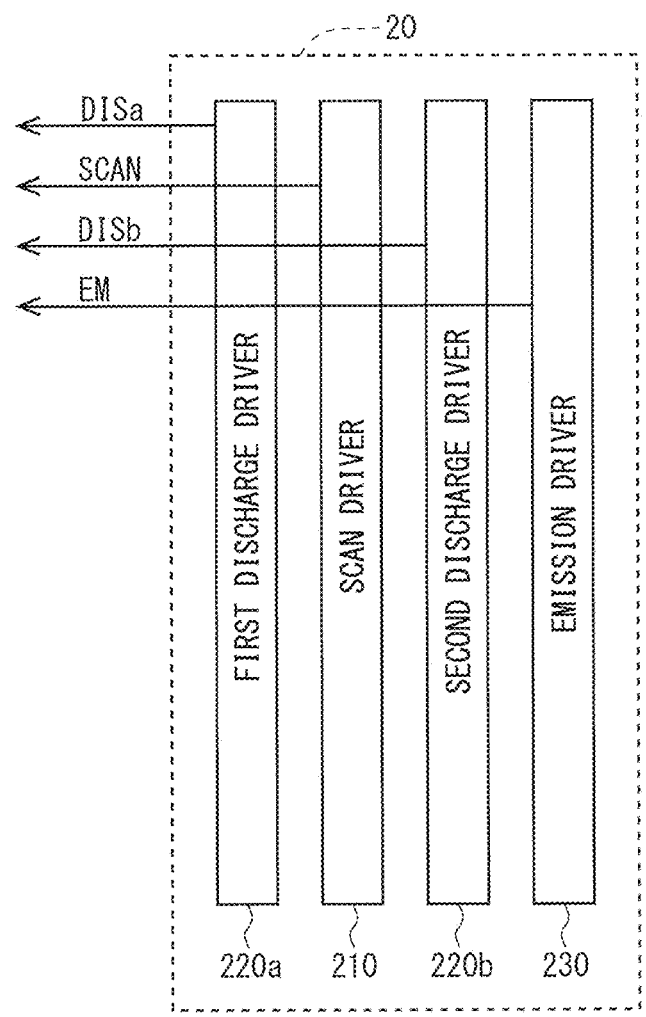
FIG. 22 is a diagram showing an internal functional configuration of a panel driving unit in the third embodiment.

FIG. 22 is a diagram showing an internal functional configuration of a panel driving unit 20. In the present embodiment, the panel driving unit 20 includes a scan driver (write control circuit) 210 that drives write control lines SCAN; a first discharge driver (first initialization control circuit) 220a that drives first initialization control lines DISa; a second discharge driver (second initialization control circuit) 220b that drives second initialization control lines DISb; and an emission driver (light emission control circuit) 230 that drives light emission control lines EM.

In a configuration such as that described above, regarding driving of horizontal scanning lines (the write control lines SCAN, the first initialization control lines DISa, and the second initialization control lines DISb), three-channel driving is performed in a high-load region and one-channel driving is performed in a low-load region. Note that in the present embodiment, the write control lines SCAN, the first initialization control lines DISa, and the second initialization control lines DISb correspond to scanning lines of a plurality of types (three types).

<3.2 Configurations of a Scan Driver and Discharge Drivers>

Figure 23:
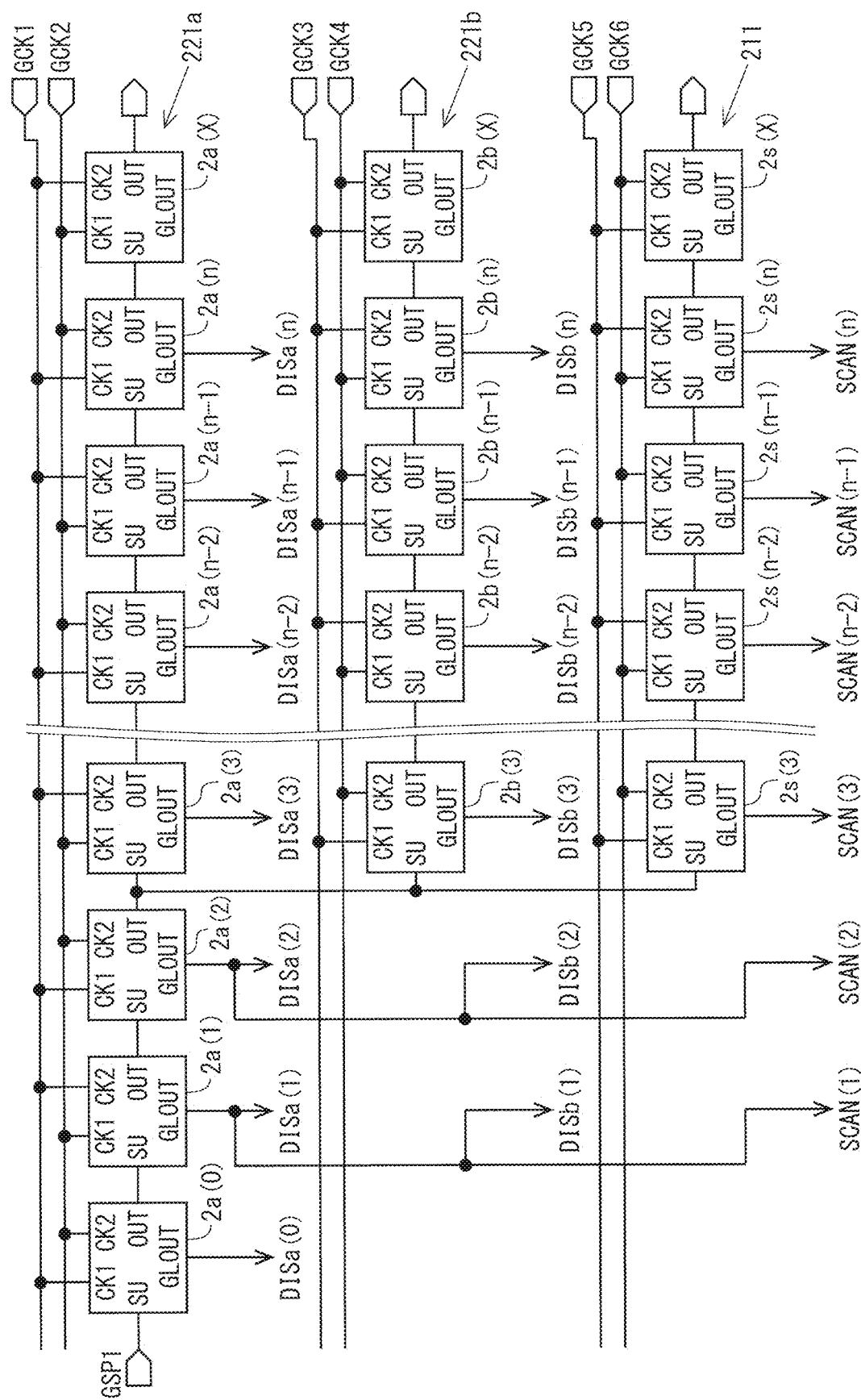
FIG. 23 is a block diagram showing configurations of a scan driver and discharge drivers (a first discharge driver and a second discharge driver) in the third embodiment.

FIG. 23 is a block diagram showing configurations of a scan driver 210 and discharge drivers (a first discharge driver 220a and a second discharge driver 220b). The scan driver 210 includes a shift register 211 including unit circuits 2s(3) to 2s(n) corresponding to the third to nth rows; and a dummy unit circuit 2s(X) on an output-end side. The first discharge driver 220a includes a shift register 221a including a dummy unit circuit 2a(0) on an input-end side; unit circuits 2a(1) to 2a(n) corresponding to the first to nth rows; and a dummy unit circuit 2a(X) on an output-end side. The second discharge driver 220b includes a shift register 221b including unit circuits 2b(3) to 2b(n) corresponding to the third to nth rows; and a dummy unit circuit 2b(X) on an output-end side.

In the present embodiment, too, a region inside the display unit 10 is segmented into the first and second rows being a low-load region with a low load on horizontal scanning lines; and the third to nth rows being a high-load region with a high load on horizontal scanning lines. As can be grasped from FIG. 23, the shift register 221a included in the first discharge driver 220a is provided with unit circuits 2 for all rows, but the shift register 211 included in the scan driver 210 and the shift register 221b included in the second discharge driver 220b are not provided with unit circuits 2 corresponding to the first and second rows being the low-load region. That is, excluding the unit circuits 2 that do not contribute to display, the shift register 221a includes the unit circuits 2a(1) and 2a(2) corresponding to the first and second rows being the low-load region; and the unit circuits 2a(3) to 2a(n) corresponding to the third to nth rows being the high-load region, the shift register 221b includes only the unit circuits 2b(3) to 2b(n) corresponding to the third to nth rows being the high-load region, and the shift register 211 includes only the unit circuits 2s(3) to 2s(n) corresponding to the third to nth rows being the high-load region.

When taking a look at horizontal scanning lines disposed in the low-load region, for each row, a write control line SCAN, a first initialization control line DISa, and a second initialization control line DISb are connected to each other (see FIG. 23). As such, for the horizontal scanning lines disposed in the low-load region, three scanning lines (a write control line SCAN, a first initialization control line DISa, and a second initialization control line DISb) which are scanning lines of three types are connected to each other for each row.

To the shift register 221a there are provided a gate start pulse signal GSP1 and gate clock signals GCK1 and GCK2. To the shift register 221b there are provided gate clock signals GCK3 and GCK4. To the shift register 211 there are provided gate clock signals GCK5 and GCK6.

Regarding the shift register 211, when the unit circuit 2s(3) is defined as the first stage, the gate clock signals GCK5 and GCK6 are provided in the following manner. To unit circuits 2 of odd-numbered stages there are provided the gate clock signal GCK5 as a clock signal CK1, and the gate clock signal GCK6 as a clock signal CK2. To unit circuits 2 of even-numbered stages there are provided the gate clock signal GCK6 as a clock signal CK1, and the gate clock signal GCK5 as a clock signal CK2. Regarding the shift register 221a, when the unit circuit 2a(0) is defined as the first stage, the gate clock signals GCK1 and GCK2 are provided in the following manner. To unit circuits 2 of odd-numbered stages there are provided the gate clock signal GCK1 as a clock signal CK1, and the gate clock signal GCK2 as a clock signal CK2. To unit circuits 2 of even-numbered stages there are provided the gate clock signal GCK2 as a clock signal CK1, and the gate clock signal GCK1 as a clock signal CK2. In addition, the gate start pulse signal GSP1 is provided to the unit circuit 2a(0) in the shift register 221a. Regarding the shift register 221b, when the unit circuit 2b(3) is defined as the first stage, the gate clock signals GCK3 and GCK4 are provided in the following manner. To unit circuits 2 of odd-numbered stages there are provided the gate clock signal GCK3 as a clock signal CK1, and the gate clock signal GCK4 as a clock signal CK2. To unit circuits 2 of even-numbered stages there are provided the gate clock signal GCK4 as a clock signal CK1, and the gate clock signal GCK3 as a clock signal CK2.

Output signals GLOUT outputted from the unit circuits 2s(3) to 2s(n) in the shift register 211 are provided as write control signals SCAN(3) to SCAN(n) to write control lines in the third to nth rows. Output signals GLOUT outputted from the unit circuits 2a(3) to 2a(n) in the shift register 221a are provided as first initialization control signals DISa(3) to DISa(n) to first initialization control lines in the third to nth rows. Output signals GLOUT outputted from the unit circuits 2a(1) and 2a(2) in the shift register 221a are provided as first initialization control signals DISa(1) and DISa(2) to first initialization control lines in the first and second rows, provided as second initialization control signals DISb(1) and DISb(2) to second initialization control lines in the first and second rows, and provided as write control signals SCAN(1) and SCAN(2) to write control lines in the first and second rows. In addition, an output signal OUT outputted from the unit circuit 2a(2) in the shift register 221a is provided as a set signal SU to the unit circuit 2a(3), provided as a start pulse signal to the shift register 221b (provided as a set signal SU to the unit circuit 2b(3) in the shift register 221b), and provided as a start pulse signal to the shift register 211 (provided as a set signal SU to the unit circuit 2s(3) in the shift register 211). Output signals GLOUT outputted from the unit circuits 2b(3) to 2b(n) in the shift register 221b are provided as second initialization control signals DISb(3) to DISb(n) to second initialization control lines in the third to nth rows.

<3.3 Overall Operation>

Figure 24:
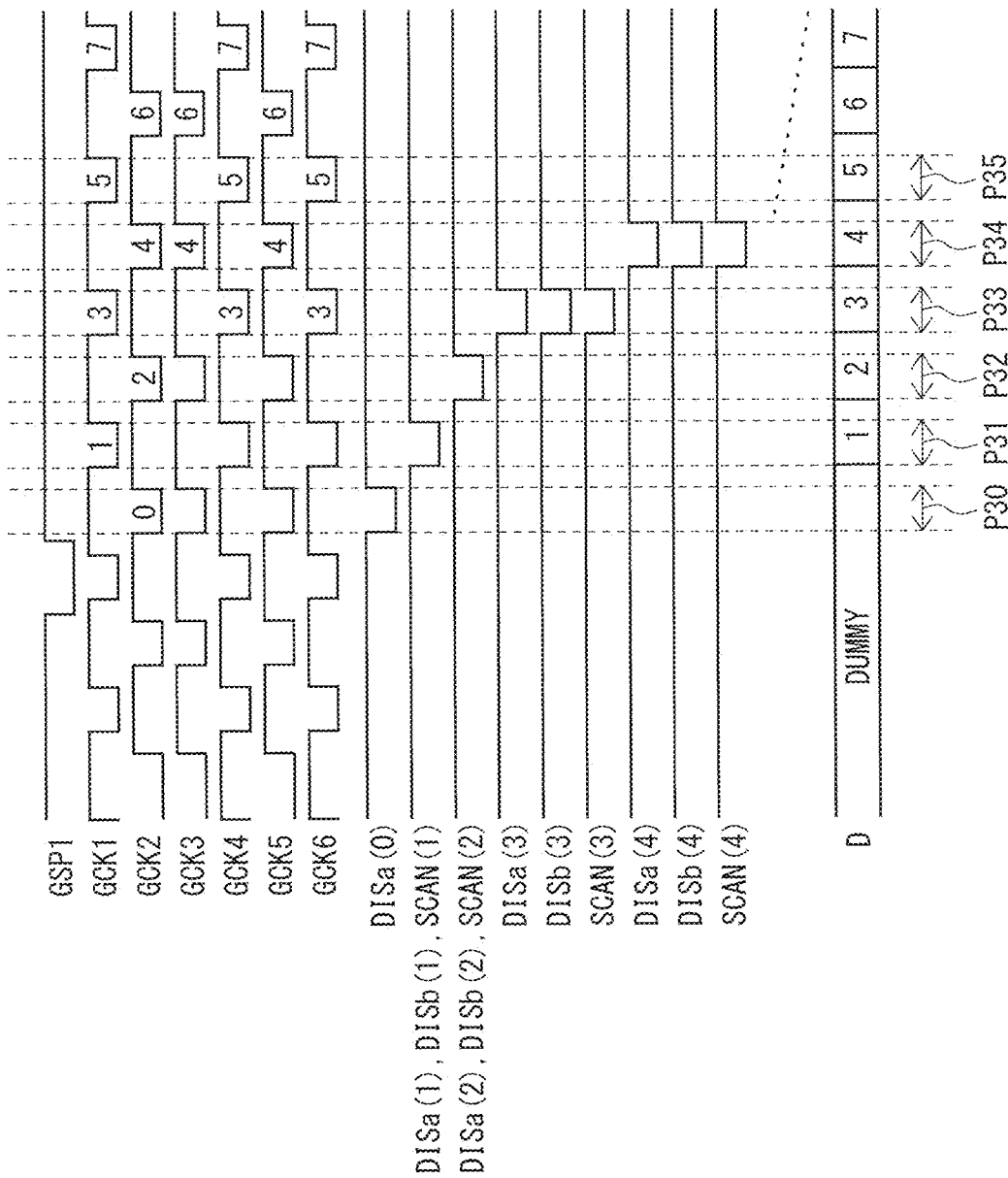
FIG. 24 is a signal waveform diagram for describing overall operation in the third embodiment.

FIG. 24 is a signal waveform diagram for describing overall operation in the present embodiment. After outputting a pulse of the gate start pulse signal GSP1, during a period P30, a pulse of an output signal GLOUT is outputted from the unit circuit 2a(0), based on a pulse of the gate clock signal GCK2. That is, during the period P30, a pulse of a first initialization control signal for a dummy DISa(0) is outputted.

During a period P31, a pulse of an output signal GLOUT is outputted from the unit circuit 2a(1), based on a pulse of the gate clock signal GCK1. The output signal GLOUT outputted from the unit circuit 2a(1) is provided as a first initialization control signal DISa(1) to the first initialization control line in the first row, provided as a second initialization control signal DISb(1) to the second initialization control line in the first row, and provided as a write control signal SCAN(1) to the write control line in the first row. Thus, during the period P31, pulses of the first initialization control signal DISa(1), the second initialization control signal DISb(1), and the write control signal SCAN(1) are outputted.

During a period P32, a pulse of an output signal GLOUT is outputted from the unit circuit 2a(2), based on a pulse of the gate clock signal GCK2. The output signal GLOUT outputted from the unit circuit 2a(2) is provided as a first initialization control signal DISa(2) to the first initialization control line in the second row, provided as a second initialization control signal DISb(2) to the second initialization control line in the second row, and provided as a write control signal SCAN(2) to the write control line in the second row. Thus, during the period P32, pulses of the first initialization control signal DISa(2), the second initialization control signal DISb(2), and the write control signal SCAN (2) are outputted.

During a period P33, a pulse of an output signal GLOUT is outputted from the unit circuit 2a(3), based on a pulse of the gate clock signal GCK1. The output signal GLOUT outputted from the unit circuit 2a(3) is provided as a first initialization control signal DISa(3) to the first initialization control line in the third row. Thus, during the period P33, a pulse of the first initialization control signal DISa(3) is outputted. In addition, as described above, an output signal OUT outputted from the unit circuit 2a(2) is provided as a start pulse signal to the shift register 221b (provided as a set signal SU to the unit circuit 2b(3) in the shift register 221b). By this, during the period P33, a pulse of an output signal GLOUT is outputted from the unit circuit 2b(3), based on a pulse of the gate clock signal GCK4. Thus, during the period P33, a pulse of a second initialization control signal DISb(3) is outputted. Furthermore, as described above, the output signal OUT outputted from the unit circuit 2a(2) is provided as a start pulse signal to the shift register 211 (provided as a set signal SU to the unit circuit 2s(3) in the shift register 211). By this, during the period P33, a pulse of an output signal GLOUT is outputted from the unit circuit 2s(3), based on a pulse of the gate clock signal GCK6. Thus, during the period P33, a pulse of a write control signal SCAN(3) is outputted.

During a period P34, a pulse of an output signal GLOUT is outputted from the unit circuit 2a(4), based on a pulse of the gate clock signal GCK2. The output signal GLOUT outputted from the unit circuit 2a(4) is provided as a first initialization control signal DISa(4) to the first initialization control line in the fourth row. Thus, during the period P34, a pulse of the first initialization control signal DISa(4) is outputted. In addition, during the period P34, a pulse of an output signal GLOUT is outputted from the unit circuit 2b(4), based on a pulse of the gate clock signal GCK3. The output signal GLOUT outputted from the unit circuit 2b(4) is provided as a second initialization control signal DISb(4) to the second initialization control line in the fourth row. Thus, during the period P34, a pulse of the second initialization control signal DISb(4) is outputted. Furthermore, during the period P34, a pulse of an output signal GLOUT is outputted from the unit circuit 2s(4), based on a pulse of the gate clock signal GCK5. The output signal GLOUT outputted from the unit circuit 2s(4) is provided as a write control signal SCAN(4) to the write control line in the fourth row. Thus, during the period P34, a pulse of the write control signal SCAN(4) is outputted.

During a period P35 and subsequent periods, a pulse of a first initialization control signal DISa is outputted from a unit circuit 2 in the shift register 221a, based on a pulse of the gate clock signal GCK1 or the gate clock signal GCK2, a pulse of a second initialization control signal DISb is outputted from a unit circuit 2 in the shift register 221b, based on a pulse of the gate clock signal GCK3 or the gate clock signal GCK4, and a pulse of a write control signal SCAN is outputted from a unit circuit 2 in the shift register 211, based on a pulse of the gate clock signal GCK5 or the gate clock signal GCK6.

As above, during the periods P31 and P32, first initialization control lines DISa, second initialization control lines DISb, and write control lines SCAN are driven by one-channel driving, and during the period P33 and subsequent periods, first initialization control lines DISa, second initialization control lines DISb, and write control lines SCAN are driven by three-channel driving. That is, one-channel driving is performed in the low-load region and three-channel driving is performed in the high-load region.

<3.4 Effect>

In the present embodiment, too, as in the first embodiment, occurrence of a difference in luminance between the low-load region and the high-load region can be suppressed.

4. Fourth Embodiment

<4.1 Overall Configuration>

As in the second embodiment, a display unit 10 of an organic EL display device according to the present embodiment has a circular shape (see FIG. 18). In the present embodiment, as in the third embodiment, first initialization control lines DISa and second initialization control lines DISb are disposed as initialization control lines in the display unit 10. Thus, a pixel circuit 100 also has the configuration shown in FIG. 21, as in the third embodiment. In addition, a panel driving unit 20 also has the configuration shown in FIG. 22, as in the third embodiment. In a configuration such as that described above, regarding driving of horizontal scanning lines (write control lines SCAN, first initialization control lines DISa, and second initialization control lines DISb), three-channel driving is performed in a high-load region and one-channel driving is performed in low-load regions. Note that as in the second embodiment, the first and second rows and the (n−1)th and nth rows correspond to the low-load regions, and the third to (n−2)th rows correspond to the high-load region.

<4.2 Configurations of a Scan Driver and Discharge Drivers>

Figure 25:
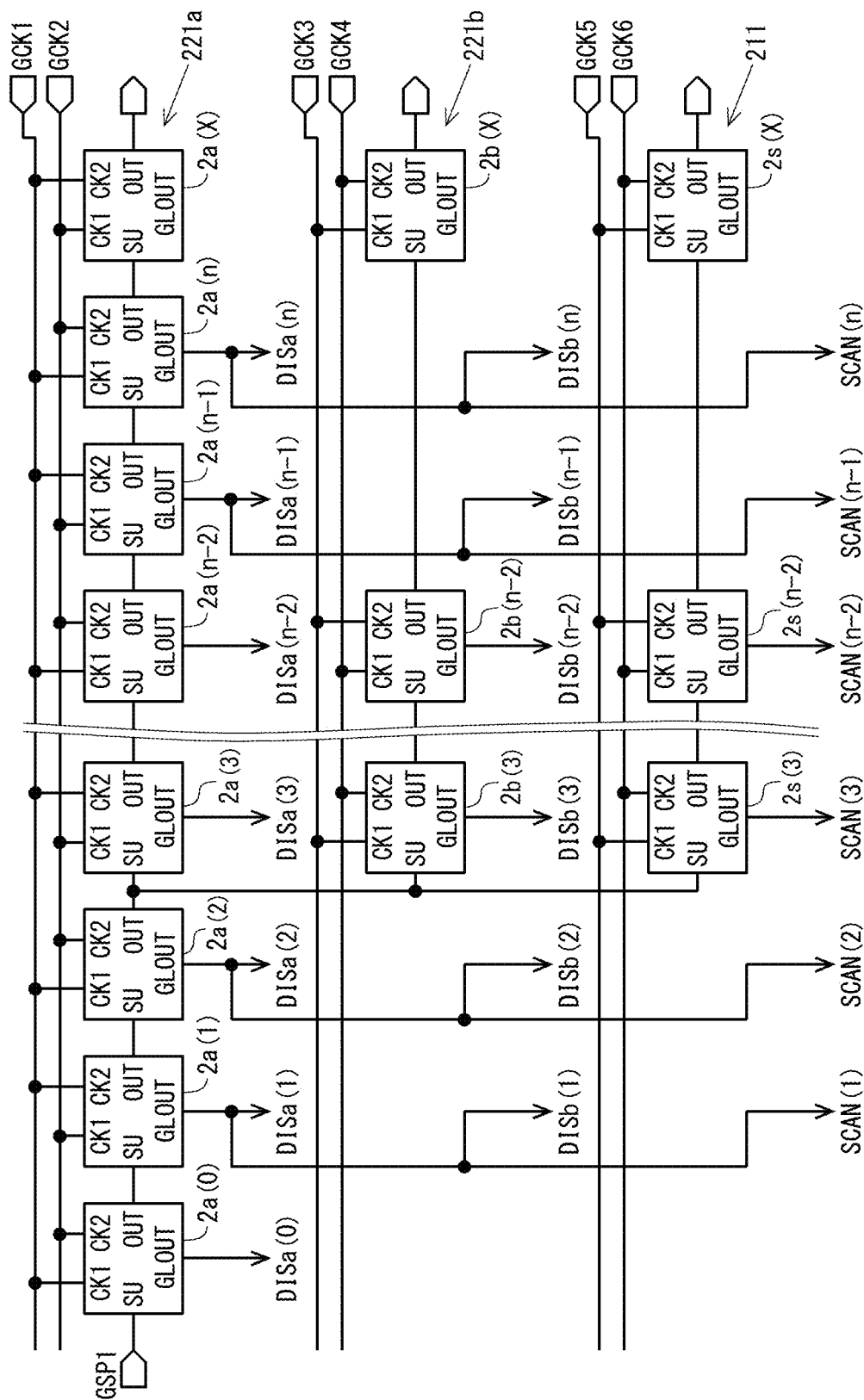
FIG. 25 is a block diagram showing configurations of a scan driver and discharge drivers (a first discharge driver and a second discharge driver) in a fourth embodiment.

FIG. 25 is a block diagram showing configurations of a scan driver 210 and discharge drivers (a first discharge driver 220a and a second discharge driver 220b). A shift register 221a included in the first discharge driver 220a is provided with unit circuits 2 for all rows. A shift register 221b included in the second discharge driver 220b and a shift register 211 included in the scan driver 210 are not provided with unit circuits 2 corresponding to the first and second rows and unit circuits 2 corresponding to the (n−1)th and nth rows. That is, in the present embodiment, excluding unit circuits 2 that do not contribute to display, the shift register 221b includes only unit circuits 2b(3) to 2b(n−2) corresponding to the third to (n−2)th rows being the high-load region, and the shift register 211 includes only unit circuits 2s(3) to 2s(n−2) corresponding to the third to (n−2)th rows being the high-load region.

<4.3 Overall Operation>

Figure 26:
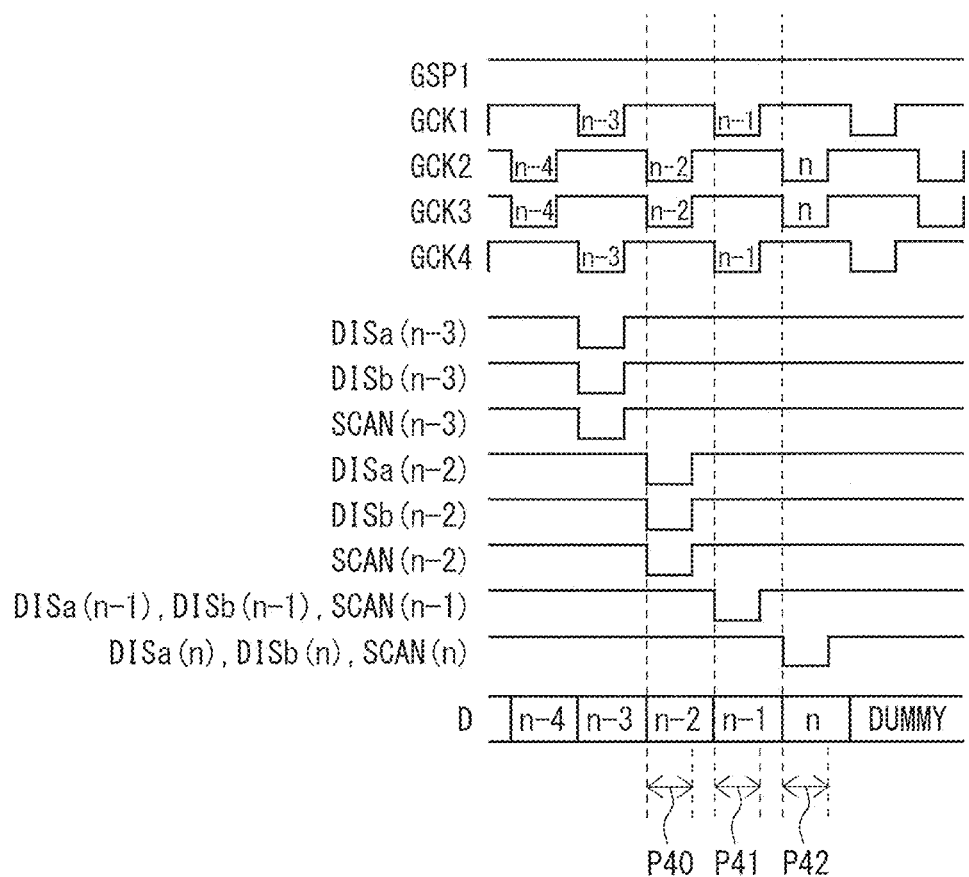
FIG. 26 is a signal waveform diagram for describing overall operation in the fourth embodiment.

FIG. 26 is a signal waveform diagram for describing overall operation in the present embodiment. Note that FIG. 26 only shows waveforms for periods during which rows of a vicinity of a lower edge portion of the display unit 10 are driven.

During periods before a period P40, the same operation as that of the third embodiment is performed. Note that during the period P40, a first initialization control line DISa, a second initialization control line DISb, and a write control line SCAN are driven by three-channel driving.

During a period P41, a pulse of an output signal GLOUT is outputted from a unit circuit 2a(n−1), based on a pulse of a gate clock signal GCK1. The output signal GLOUT outputted from the unit circuit 2a(n−1) is provided as a first initialization control signal DISa(n−1) to a first initialization control line in an (n−1)th row, provided as a second initialization control signal DISb(n−1) to a second initialization control line in the (n−1)th row, and provided as a write control signal SCAN(n−1) to a write control line in the (n−1)th row. Thus, during the period P41, pulses of the first initialization control signal DISa(n−1), the second initialization control signal DISb(n−1), and the write control signal SCAN(n−1) are outputted.

During a period P42, a pulse of an output signal GLOUT is outputted from a unit circuit 2a(n), based on a pulse of a gate clock signal GCK2. The output signal GLOUT outputted from the unit circuit 2a(n) is provided as a first initialization control signal DISa(n) to a first initialization control line in an nth row, provided as a second initialization control signal DISb(n) to a second initialization control line in the nth row, and provided as a write control signal SCAN(n) to a write control line in the nth row. Thus, during the period P42, pulses of the first initialization control signal DISa(n), the second initialization control signal DISb(n), and the write control signal SCAN(n) are outputted.

In the above-described manner, one-channel driving is performed for horizontal scanning lines in the first and second rows, three-channel driving is performed for horizontal scanning lines in the third to (n−2)th rows, and one-channel driving is performed for horizontal scanning lines in the (n−1)th and nth rows. As such, as in the third embodiment, one-channel driving is performed in the low-load regions and three-channel driving is performed in the high-load region.

<4.4 Effect>

According to the present embodiment, as in the second embodiment, the organic EL display device having the circular display unit 10 can suppress occurrence of a difference in luminance between the low-load regions and the high-load region.

5. Others

Although description is made using organic EL display devices as an example in the above-described embodiments and variants, the device is not limited thereto, and the present disclosure can also be applied to inorganic EL display devices, QLED display devices, etc. In addition, although a shape obtained by combining a semicircle and a rectangle (see FIG. 2) and a circular shape (see FIG. 18) are exemplified as the shapes of a display unit, the present disclosure can also be applied to display devices including a display unit having an other non-rectangular shape.

DESCRIPTION OF REFERENCE CHARACTERS 2, 2a, 2b, and 2s: UNIT CIRCUIT
10: DISPLAY UNIT
20: PANEL DRIVING UNIT
100: PIXEL CIRCUIT
210: SCAN DRIVER (WRITE CONTROL CIRCUIT)
220: DISCHARGE DRIVER (INITIALIZATION CONTROL CIRCUIT)
220a: FIRST DISCHARGE DRIVER (FIRST INITIALIZATION CONTROL CIRCUIT)
220b: SECOND DISCHARGE DRIVER (SECOND INITIALIZATION CONTROL CIRCUIT)
230: EMISSION DRIVER (LIGHT EMISSION CONTROL CIRCUIT)
SCAN: WRITE CONTROL LINE, WRITE CONTROL SIGNAL
DIS: INITIALIZATION CONTROL LINE, INITIALIZATION CONTROL SIGNAL
DISa: FIRST INITIALIZATION CONTROL LINE, FIRST INITIALIZATION CONTROL SIGNAL
DISb: SECOND INITIALIZATION CONTROL LINE, SECOND INITIALIZATION CONTROL SIGNAL
EM: LIGHT EMISSION CONTROL LINE, LIGHT EMISSION CONTROL SIGNAL
GLOUT and OUT: OUTPUT SIGNAL FROM UNIT CIRCUIT
L1: ORGANIC EL ELEMENT
T1: FIRST INITIALIZATION TRANSISTOR
T2: THRESHOLD VOLTAGE COMPENSATION TRANSISTOR
T3: WRITE CONTROL TRANSISTOR
T4: DRIVE TRANSISTOR
T5: POWER SUPPLY CONTROL TRANSISTOR
T6: LIGHT EMISSION CONTROL TRANSISTOR
T7: SECOND INITIALIZATION TRANSISTOR

The invention claimed is:

1. A display device comprising: a display unit in which scanning lines of a plurality of types are disposed as horizontal scanning lines; and a plurality of scanning drive circuits configured to drive the scanning lines of the respective plurality of types, the display unit having a non-rectangular shape, wherein
   a region inside the display unit is segmented into a high-load region with a high load on the horizontal scanning lines and a low-load region with a low load on the horizontal scanning lines,
   scanning lines of the plurality of types disposed in the high-load region are driven by the respective plurality of scanning drive circuits,
   scanning lines of the plurality of types disposed in the low-load region are driven by one of the plurality of scanning drive circuits,
   each of the plurality of scanning drive circuits includes a shift register,
   the scanning lines of the plurality of types includes first type scanning lines and second type scanning lines, and
   the plurality of scanning drive circuits includes a first scanning drive circuit configured to drive the first type scanning lines disposed in the high-load region, the first type scanning lines disposed in the low-load region, and the second type scanning lines disposed in the low-load region, and a second scanning drive circuit configured to drive the second type scanning lines disposed in the high-load region.

2. The display device according to claim 1, wherein
   the scanning lines of the plurality of types are scanning lines of K types, with K being an integer greater than or equal to 2, the scanning lines of the K types including both the first type scanning lines and the second type scanning lines, and
   for scanning lines disposed in the low-load region, K scanning lines are connected to each other for each row, the K scanning lines being scanning lines of the K types.

3. The display device according to claim 1, wherein
   the scanning lines of the plurality of types include a write control line and an initialization control line, the plurality of scanning drive circuits include a write control circuit and an initialization control circuit, the display unit includes a plurality of pixel circuits, each connected the write control line and the initialization control line, each of the pixel circuits includes:
- a display element provided between a first power supply line and a second power supply line and having a first terminal on a side of the first power supply line and a second terminal on a side of the second power supply line, and configured to be driven by current, the first power supply line being configured to supply a high-level power supply voltage and the second power supply line being configured to supply a low-level power supply voltage;
- a drive transistor having a control terminal, a first conductive terminal, and a second conductive terminal, and provided in series with the display element;
- a capacitor having one terminal connected to the control terminal of the drive transistor, and another terminal connected to the first power supply line;
- a write control transistor having a control terminal connected to the write control line; a first conductive terminal connected to a data signal line configured to supply a data signal; and a second conductive terminal connected to the first conductive terminal of the drive transistor;
- a threshold voltage compensation transistor having a control terminal connected to the write control line; a first conductive terminal connected to the second conductive terminal of the drive transistor; and a second conductive terminal connected to the control terminal of the drive transistor; and
- an initialization transistor having a control terminal connected to the initialization control line; a first conductive terminal connected to the control terminal of the drive transistor; and a second conductive terminal connected to an initialization power supply line configured to supply an initialization voltage, the write control line disposed in the high-load region is driven by the write control circuit, the initialization control line disposed in the high-load region is driven by the initialization control circuit, and the write control line disposed in the low-load region and the initialization control line disposed in the low-load region are driven by any one of the write control circuit and the initialization control circuit.

4. The display device according to claim 3, wherein light emission control lines configured to control light emission of the display element are disposed in the display unit, and each of the pixel circuits includes:
- a power supply control transistor having a control terminal connected to a corresponding one of the light emission control lines; a first conductive terminal connected to the first power supply line; and a second conductive terminal connected to the first conductive terminal of the drive transistor; and
- a light emission control transistor having a control terminal connected to the corresponding one of the light emission control lines; a first conductive terminal connected to the second conductive terminal of the drive transistor; and a second conductive terminal connected to the first terminal of the display element.

5. The display device according to claim 1, wherein the scanning lines of the plurality of types include a write control line, a first initialization control line, and a second initialization control line, the plurality of scanning drive circuits include a write control circuit, a first initialization control circuit, and a second initialization control circuit, the display unit includes a plurality of pixel circuits, each connected to the write control line, the first initialization control line, and the second initialization control line, each of the pixel circuits includes:
- a display element provided between a first power supply line and a second power supply line and having a first terminal on a side of the first power supply line and a second terminal on a side of the second power supply line, and configured to be driven by current, the first power supply line being configured to supply a high-level power supply voltage and the second power supply line being configured to supply a low-level power supply voltage;
- a drive transistor having a control terminal, a first conductive terminal, and a second conductive terminal, and provided in series with the display element;
- a capacitor having one terminal connected to the control terminal of the drive transistor, and another terminal connected to the first power supply line;
- a write control transistor having a control terminal connected to the write control line; a first conductive terminal connected to a data signal line configured to supply a data signal; and a second conductive terminal connected to the first conductive terminal of the drive transistor;
- a threshold voltage compensation transistor having a control terminal connected to the write control line; a first conductive terminal connected to the second conductive terminal of the drive transistor; and a second conductive terminal connected to the control terminal of the drive transistor;
- a first initialization transistor having a control terminal connected to the first initialization control line; a first conductive terminal connected to the control terminal of the drive transistor; and a second conductive terminal connected to an initialization power supply line configured to supply an initialization voltage; and
- a second initialization transistor having a control terminal connected to the second initialization control line; a first conductive terminal connected to the first terminal of the display element; and a second conductive terminal connected to the initialization power supply line, the write control line disposed in the high-load region is driven by the write control circuit, the first initialization control line disposed in the high-load region is driven by the first initialization control circuit, the second initialization control line disposed in the high-load region is driven by the second initialization control circuit, and the write control line disposed in the low-load region, the first initialization control line disposed in the low-load region, and the second initialization control line disposed in the low-load region are driven by any one of the write control circuit, the first initialization control circuit, and the second initialization control circuit.

6. The display device according to claim 1, wherein an output signal from one of the unit circuits included in the shift register included in the first scanning drive circuit is provided as a start pulse signal to the shift register included in the second scanning drive circuit.

7. The display device according to claim 1, wherein a start pulse signal and a clock signal are provided to the shift register so that a plurality of consecutive pulses are outputted as an output signal from each unit circuit included in the shift register.

8. The display device according to claim 1, wherein
the scanning lines of the plurality of types include a write control line and an initialization control line,
the plurality of scanning drive circuits include a write control circuit and an initialization control circuit,
the write control line disposed in the high-load region is driven by the write control circuit,
the initialization control line disposed in the high-load region is driven by the initialization control circuit,
the write control line disposed in the low-load region and the initialization control line disposed in the low-load region are driven by the write control circuit,
the write control circuit and the initialization control circuit each include a shift register, and
start pulse signals of different waveforms are provided to a shift register included in the write control circuit and a shift register included in the initialization control circuit.

9. The display device according to claim 1, wherein
the display unit has a shape obtained by combining a semicircle and a rectangle,
a vertex of the semicircle is located on a straight line extending in a vertical scanning direction with reference to a center of a linear portion of the semicircle, and
a region near the vertex of the semicircle in the region inside the display unit is segmented as the low-load region.

10. The display device according to claim 1, wherein
the display unit has a circular shape, and
a vicinity of a one-edge portion and a vicinity of an other-edge portion in a vertical scanning direction with reference to a center of the display unit in the region inside the display unit each are segmented as the low-load region.

11. The display device according to claim 1, wherein
the scanning lines of the plurality of types disposed in the high-load region are driven from both of a one-edge side and an other-edge side of the display unit, and
the scanning lines of the plurality of types disposed in the low-load region are driven from only one of the one-edge side and the other-edge side of the display unit.

12. A display device comprising: a display unit in which scanning lines of a plurality of types are disposed as horizontal scanning lines; and a plurality of scanning drive circuits configured to drive the scanning lines of the respective plurality of types, the display unit having a non-rectangular shape, wherein
a region inside the display unit is segmented into a high-load region with a high load on the horizontal scanning lines and a low-load region with a low load on the horizontal scanning lines,
scanning lines of the plurality of types disposed in the high-load region are driven by the respective plurality of scanning drive circuits,
scanning lines of the plurality of types disposed in the low-load region are driven by one of the plurality of scanning drive circuits,
each of the scanning drive circuits includes a shift register, a shift register included in a scanning drive circuit that is configured to drive scanning lines disposed in the low-load region includes, excluding a unit circuit that does not contribute to display, unit circuits corresponding to scanning lines disposed in the low-load region and unit circuits corresponding to scanning lines disposed in the high-load region,
a shift register included in a scanning drive circuit that is configured to drive only scanning lines disposed in the high-load region includes, excluding a unit circuit that does not contribute to display, only unit circuits corresponding to scanning lines disposed in the high-load region,
an output signal from each unit circuit included in the shift register is provided to a corresponding scanning line and a unit circuit of a subsequent stage, and
regarding a shift register included in a scanning drive circuit configured to drive scanning lines disposed in the low-load region,
each unit circuit corresponding to a scanning line disposed in the high-load region is provided with an output terminal configured to output the output signal to a corresponding scanning line; and an output terminal configured to output the output signal to a unit circuit of a subsequent stage, and
each unit circuit corresponding to a scanning line disposed in the low-load region is provided with only one output terminal configured to output the output signal to a corresponding scanning line and a unit circuit of a subsequent stage.

13. A method for driving a display device including a display unit in which scanning lines of a plurality of types are disposed as horizontal scanning lines, the display unit having a non-rectangular shape, the method comprising:
a low-load region driving step of driving, by one of a plurality of scanning drive circuits, scanning lines of the plurality of types disposed in a low-load region with a low load on the horizontal scanning lines, the low-load region being a part of a region inside the display unit; and
a high-load region driving step of driving, by the plurality of scanning drive circuits, scanning lines of the plurality of types disposed in a high-load region with a high load on the horizontal scanning lines, the high-load region being a part of the region inside the display unit, wherein
each of the plurality of scanning drive circuits includes a shift register,
the scanning lines of the plurality of types includes first type scanning lines and second type scanning lines,
the plurality of scanning drive circuits includes a first scanning drive circuit configured to drive the first type scanning lines disposed in the high-load region, the first type scanning lines disposed in the low-load region, and the second type scanning lines, and a second scanning, drive circuit configured to drive the second type scanning lines disposed in the high-load region,
in the low-load region driving step, the first type scanning lines disposed in the low-load region and the second type scanning lines disposed in the low-load region are driven by the first scanning drive circuit, and in the high-load region driving step, the first type scanning lines disposed in the high-load region are driven by the first scanning drive circuit and the second type scanning lines disposed in the high-load region are driven by the second scanning drive circuit.

\* \* \* \* \*